(12) United States Patent
Wang et al.

(10) Patent No.: US 11,984,450 B2
(45) Date of Patent: May 14, 2024

(54) SEMICONDUCTOR DEVICE HAVING SPACER RESIDUE

(71) Applicant: TAIWAN SEMICONDUCTOR MANUFACTURING CO., LTD., Hsinchu (TW)

(72) Inventors: Sung-Li Wang, Hsinchu County (TW); Pang-Yen Tsai, Hsinchu County (TW); Yasutoshi Okuno, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/838,038

(22) Filed: Jun. 10, 2022

(65) Prior Publication Data

US 2022/0328481 A1 Oct. 13, 2022

Related U.S. Application Data

(63) Continuation of application No. 17/326,005, filed on May 20, 2021, now Pat. No. 11,610,888, which is a
(Continued)

(51) Int. Cl.
*H01L 27/092* (2006.01)
*H01L 21/02* (2006.01)
(Continued)

(52) U.S. Cl.
CPC .... *H01L 27/0922* (2013.01); *H01L 21/02636* (2013.01); *H01L 21/76897* (2013.01); *H01L 21/823814* (2013.01); *H01L 21/823821* (2013.01); *H01L 21/823871* (2013.01); *H01L 27/092* (2013.01); *H01L 27/0924* (2013.01);
(Continued)

(58) Field of Classification Search
CPC .......... H01L 27/0922; H01L 21/02636; H01L 27/0924; H01L 21/823821; H01L 29/7849; H01L 29/7853; H01L 29/0653; H01L 21/76897; H01L 21/823814; H01L 29/66545; H01L 21/31111; H01L 29/45;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

CN 106711221 A 5/2017
CN 107068671 A 8/2017
TW 201435983 A 9/2014

*Primary Examiner* — Changhyun Yi
(74) *Attorney, Agent, or Firm* — Maschoff Brennan

(57) ABSTRACT

A device includes a semiconductive fin, an isolation structure, a gate structure, dielectric spacers, and source/drain epitaxial structures. The isolation structure surrounds a bottom portion of the semiconductive fin. The gate structure is over the semiconductive fin. The dielectric spacers are on opposite sides of the semiconductive fin and over the isolation structure. The dielectric spacers include nitride. The source/drain epitaxial structures are on opposite sides of the gate structure and over the dielectric spacers. The source/drain epitaxial structures have hexagon shapes.

20 Claims, 24 Drawing Sheets

Related U.S. Application Data continuation of application No. 16/927,799, filed on Jul. 13, 2020, now Pat. No. 11,211,383, which is a continuation of application No. 16/178,340, filed on Nov. 1, 2018, now Pat. No. 10,714,475.

(60) Provisional application No. 62/591,133, filed on Nov. 27, 2017.

(51) Int. Cl.

| | | |
|---|---|---|
| *H01L 21/3105* | (2006.01) | |
| *H01L 21/311* | (2006.01) | |
| *H01L 21/321* | (2006.01) | |
| *H01L 21/768* | (2006.01) | |
| *H01L 21/8238* | (2006.01) | |
| *H01L 29/08* | (2006.01) | |
| *H01L 29/45* | (2006.01) | |
| *H01L 29/66* | (2006.01) | |
| *H01L 29/78* | (2006.01) | |

(52) U.S. Cl.
CPC .......... *H01L 29/0847* (2013.01); *H01L 29/45* (2013.01); *H01L 29/456* (2013.01); *H01L 29/7853* (2013.01); *H01L 29/7854* (2013.01); *H01L 21/31053* (2013.01); *H01L 21/31111* (2013.01); *H01L 21/3212* (2013.01); *H01L 29/665* (2013.01); *H01L 29/6653* (2013.01); *H01L 29/66545* (2013.01)

(58) Field of Classification Search
CPC .............. H01L 29/0847; H01L 27/092; H01L 21/823871

See application file for complete search history.

(56) References Cited

U.S. PATENT DOCUMENTS

| | | |
|---|---|---|
| 9,236,300 B2 | 1/2016 | Liaw |
| 9,287,399 B2 | 3/2016 | Chandra |
| 9,406,804 B2 | 8/2016 | Huang et al. |
| 9,443,769 B2 | 9/2016 | Wang et al. |
| 9,496,400 B1 | 11/2016 | Balakrishnan et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,627,480 B2 | 4/2017 | Chou |
| 9,831,183 B2 | 11/2017 | Lin et al. |
| 9,859,386 B2 | 1/2018 | Ho et al. |
| 2015/0279995 A1* | 10/2015 | Maeda .............. H01L 29/66795 257/192 |
| 2015/0303118 A1* | 10/2015 | Wang .................. H01L 29/7853 257/401 |
| 2016/0148846 A1 | 5/2016 | Ok et al. |
| 2016/0315172 A1* | 10/2016 | Wu .................. H01L 21/31111 |
| 2017/0117411 A1 | 4/2017 | Kim et al. |
| 2017/0148797 A1 | 5/2017 | Kim et al. |
| 2017/0186654 A1* | 6/2017 | Li ................... H01L 21/823871 |
| 2018/0151683 A1 | 5/2018 | Yeo et al. |
| 2019/0067013 A1 | 2/2019 | Wang et al. |

\* cited by examiner

SEMICONDUCTOR DEVICE HAVING SPACER RESIDUE

PRIORITY CLAIM AND CROSS-REFERENCE

This application is a continuation of U.S. patent application Ser. No. 17/326,005, filed May 20, 2021, which is a continuation of U.S. patent application Ser. No. 16/927,799, filed Jul. 13, 2020, now U.S. Pat. No. 11,211,383, issued Dec. 28, 2021, which a continuation of U.S. patent application Ser. No. 16/178,340, filed Nov. 1, 2018, now U.S. Pat. No. 10,714,475, issued Jul. 14, 2020, which claims priority to U.S. Provisional Application Ser. No. 62/591,133, filed Nov. 27, 2017, both of which are herein incorporated by reference in their entirety.

BACKGROUND

Transistors include semiconductor regions used to form the source regions and drain regions. Since the contact resistance between metal contact plugs and the semiconductor regions is high, metal silicides are formed on the surfaces of the semiconductor regions such as silicon regions, germanium regions, silicon germanium regions in order to reduce the contact resistance. The contact plugs are formed to contact the silicide regions, and the contact resistance between the contact plugs and the silicide regions are low.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
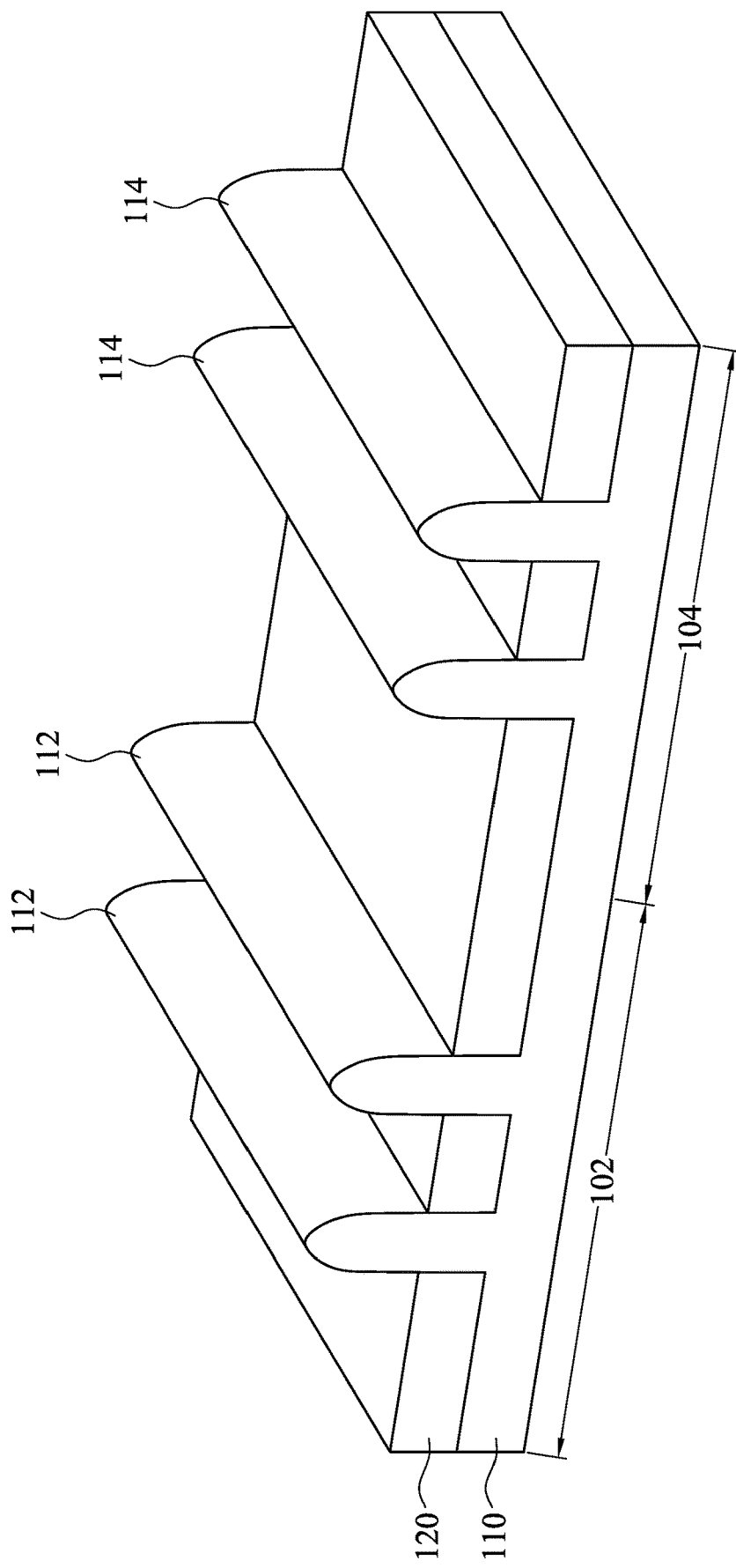
FIGS. 1-15 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the present disclosure provide some improved methods for the formation of semiconductor devices and the resulting structures. These embodiments are discussed below in the context of forming finFET transistors having a single fin or multiple fins on a bulk silicon substrate.

FIGS. 1-15 illustrate a method for manufacturing a semiconductor device at various stages in accordance with some embodiments of the present disclosure. In some embodiments, the semiconductor device shown in FIGS. 1-15 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIG. 1 is a perspective view of the semiconductor device in accordance with some embodiments of the present disclosure. A substrate 110 is provided. The substrate 110 has a first region 102 and a second region 104. In some embodiments, the substrate 110 may include silicon (Si). Alternatively, the substrate 110 may include germanium (Ge), silicon germanium, gallium arsenide (GaAs), or other appropriate semiconductor materials. In some alternative embodiments, the substrate 110 may include an epitaxial layer. Furthermore, the substrate 110 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A plurality of semiconductor fins 112 and a plurality of semiconductor fins 114 are respectively formed over the first region 102 and the second region 104 of the substrate 110. The semiconductor fins 112 and 114 serve as channels and source/drain features of transistors. It is noted that the numbers of the semiconductor fins 112 and 114 in FIG. 1 are illustrative, and should not limit the claimed scope of the present disclosure. In addition, one or more dummy fins may be disposed adjacent both sides of the semiconductor fins 112 and/or the semiconductor fins 114 to improve pattern fidelity in patterning processes.

The semiconductor fins 112 and 114 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 and 114 in this case) and developed to remove a portion of the photoresist material. The remaining photoresist material protects the underlying material from subsequent processing operations, such as etching. It should be noted that other masks, such as an oxide or silicon nitride mask, may also be used in the etching process. The semiconductor fins 112 and 114 may be made of the same material as the substrate 110 and may continuously extend or protrude from the substrate 110. The semiconductor fins 112 and 114 may be intrinsic, or appropriately doped with an n-type impurity or a p-type impurity.

In some other embodiments, the semiconductor fins 112 and 114 may be epitaxially grown. For example, exposed portions of an underlying material, such as an exposed portion of the substrate 110, may be used in an epitaxial process to form the semiconductor fins 112 and 114. A mask may be used to control the shape of the semiconductor fins 112 and 114 during the epitaxial growth process.

A plurality of isolation structures 120, such as shallow trench isolation (STI), are formed in the substrate 110 to separate various devices. The formation of the isolation structures 120 may include etching a trench in the substrate 110 and filling the trench by an insulator material such as silicon oxide, silicon nitride, or silicon oxynitride. The filled trench may have a multi-layer structure such as a thermal oxide liner layer with silicon nitride filling the trench. In some embodiments, the isolation structures 120 may be created using a process sequence such as: growing a pad oxide, forming a low pressure chemical vapor deposition (LPCVD) nitride layer, patterning an STI opening using photoresist and masking, etching a trench in the substrate 110 (to form the semiconductor fins 112 and 114), optionally growing a thermal oxide trench liner to improve the trench interface, filling the trench with oxide, using chemical mechanical planarization (CMP) to remove the excessive oxide, and recessing the thermal oxide trench liner and the oxide to form the isolation structures 120 such that top portions of the semiconductor fins 112 and 114 protrude from top surfaces of the isolation structures 120.

Figure 2:
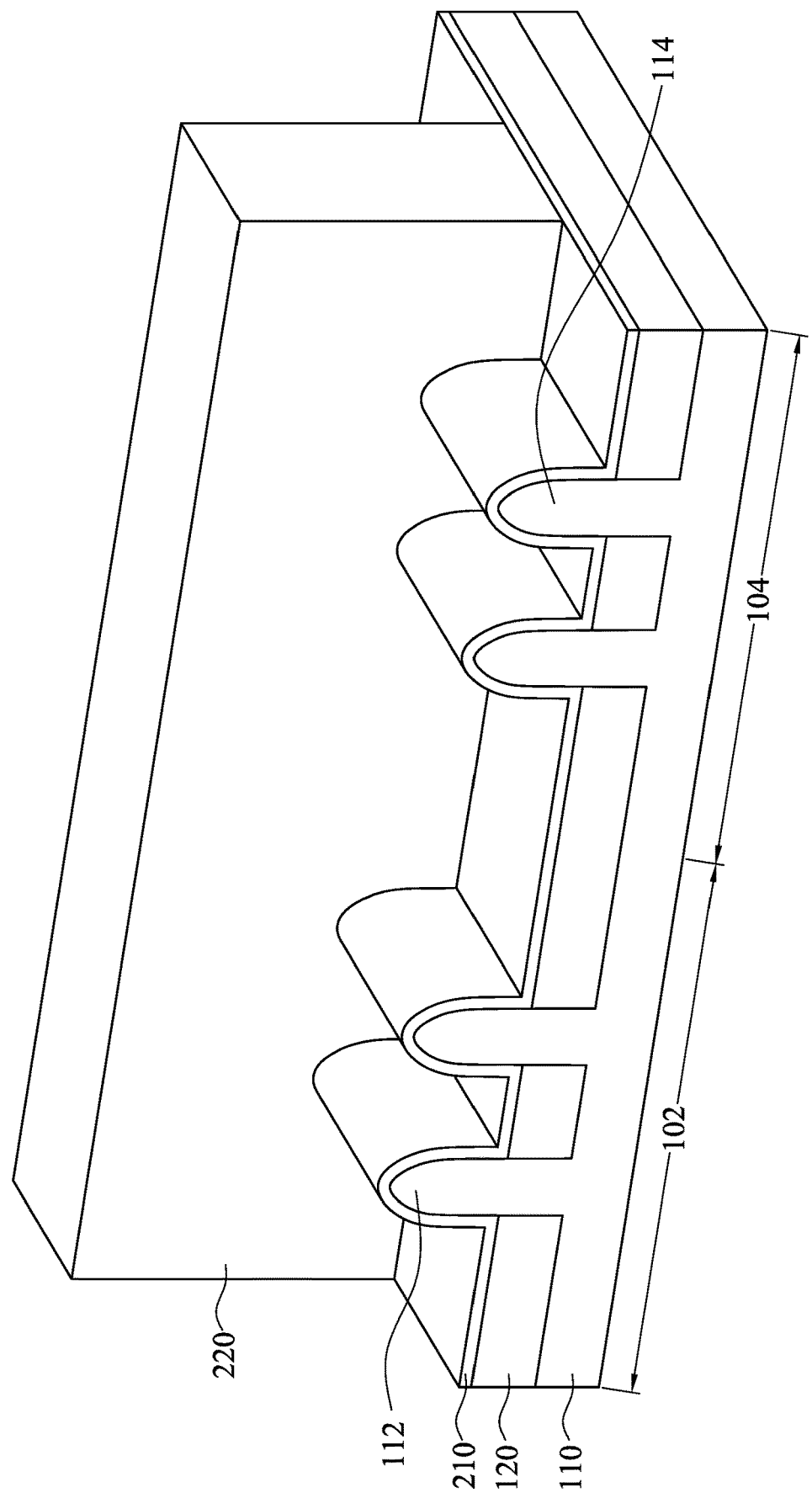

Reference is made to FIG. 2. A dummy dielectric layer 210 is conformally formed to cover the semiconductor fins 112, 114, and the isolation structures 120. In some embodiments, the dummy dielectric layer 210 may include silicon dioxide, silicon nitride, a high-κ dielectric material, or other suitable material. In various examples, the dummy dielectric layer 210 may be deposited by an ALD process, a CVD process, a subatmospheric CVD (SACVD) process, a flowable CVD process, a PVD process, or other suitable process. By way of example, the dummy dielectric layer 210 may be used to prevent damage to the semiconductor fins 112 and 114 by subsequent processing (e.g., subsequent formation of the dummy gate structure).

A dummy gate structure 220 is formed over the dummy dielectric layer 210, the semiconductor fins 112, 114, and the isolation structures 120. In some embodiments, a dummy gate layer (not shown) may be formed over the dummy dielectric layer 210, and is then patterned to form the dummy gate electrode 220. In some embodiments, the dummy gate electrode 220 may be made of polycrystalline-silicon (poly-Si), polycrystalline silicon-germanium (poly-SiGe), or other suitable materials. If a gate-first technology is employed, the dummy gate structure 220 and the dummy dielectric layer 210 are used as a gate electrode and a gate dielectric layer.

Figure 3:
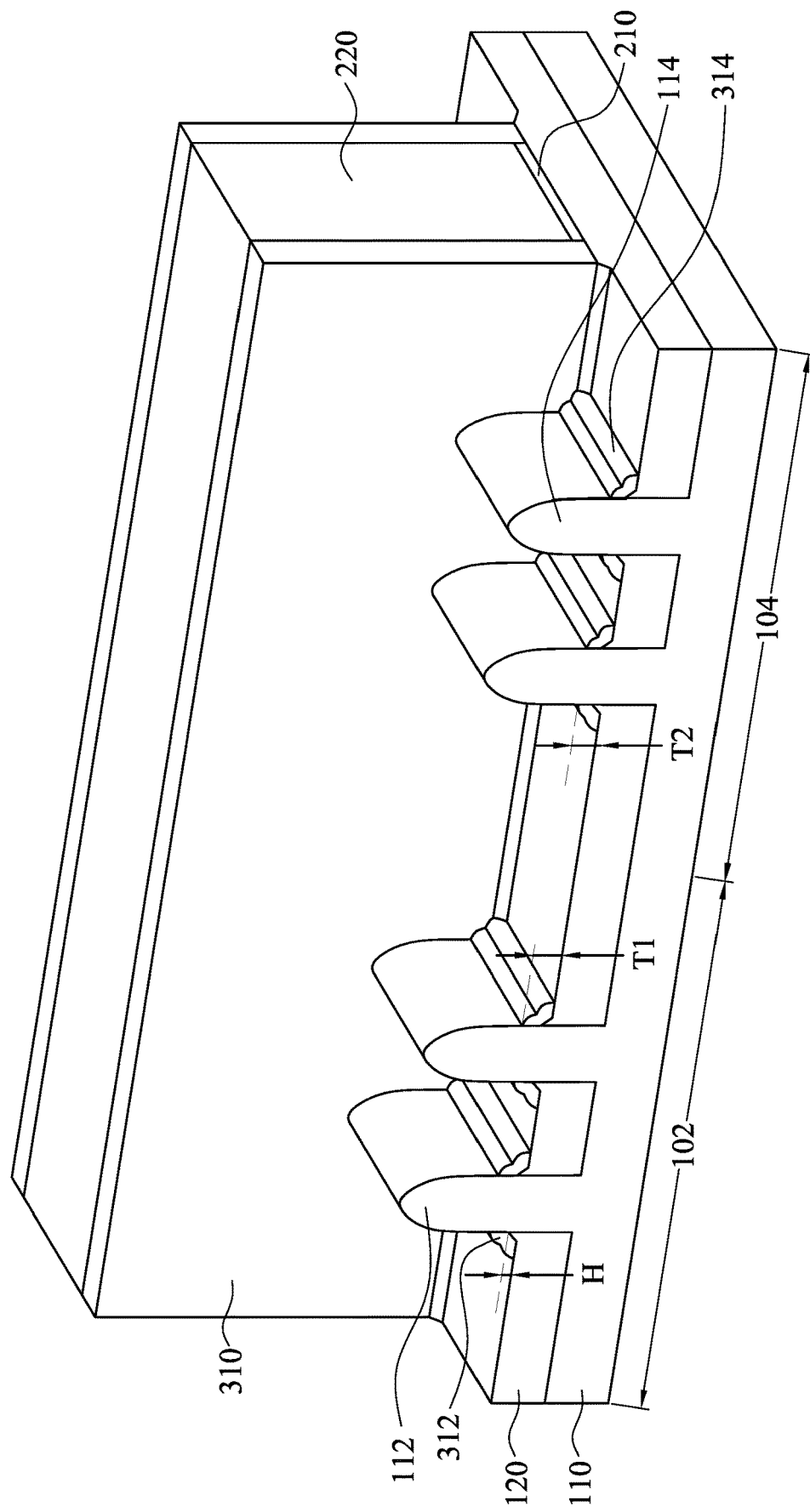

Reference is made to FIG. 3. Portions of the dummy dielectric layer 210 uncovered by the dummy gate structure 220 are removed to expose portions of the semiconductor fins 112 and 114. Then, spacer structures 310 are at least formed on opposite sides of the dummy gate structure 220 and the dummy dielectric layer 210. The spacer structures 310 may include a seal spacer and a main spacer (not shown). The spacer structures 310 include one or more dielectric materials, such as silicon oxide, silicon nitride, silicon oxynitride, SiCN, SiCxOyNz, or combinations thereof. The seal spacers are formed on sidewalls of the dummy gate structure 220 and the main spacers are formed on the seal spacers. The spacer structures 310 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 310 may include blanket forming spacer layers and then performing etching operations to remove the horizontal portions of the spacer layers. The remaining vertical portions of the spacer layers form the spacer structures 310. In some embodiments, the isolation structures 120 are recessed when the etching operation of the spacer layers is performed, and the etched amount H is in a range from about 0.5 nm to about 20 nm.

In some embodiments, spacer residues 312 and 314, which are remaining parts of the spacer structures 310 that is not removed in the operation of etching the spacer layer, exist. Specifically, in the operation of the spacer layer deposition process, the spacer layer also covers the semiconductor fins 112 and 114. When the spacer layer is etched to form the spacer structures 310, the portions of the spacer layer on sidewalls of the semiconductor fins 112 and 114 are pullback-etched. Portions of the spacer structures 310 thus remain at corners between the isolation structure 120 and the semiconductor fins 112/114 after the etching and form the spacer residues 312/314. In some other embodiments, however, the spacer residues 312 and/or 314 may be omitted. The vertical thickness T1 of the spacer residue 312 is in a range from about 0.5 nm to about 30 nm in some embodiments. The vertical thickness T2 of the spacer residue 314 is in a range from about 0.5 nm to about 30 nm in some embodiments.

Figure 4:
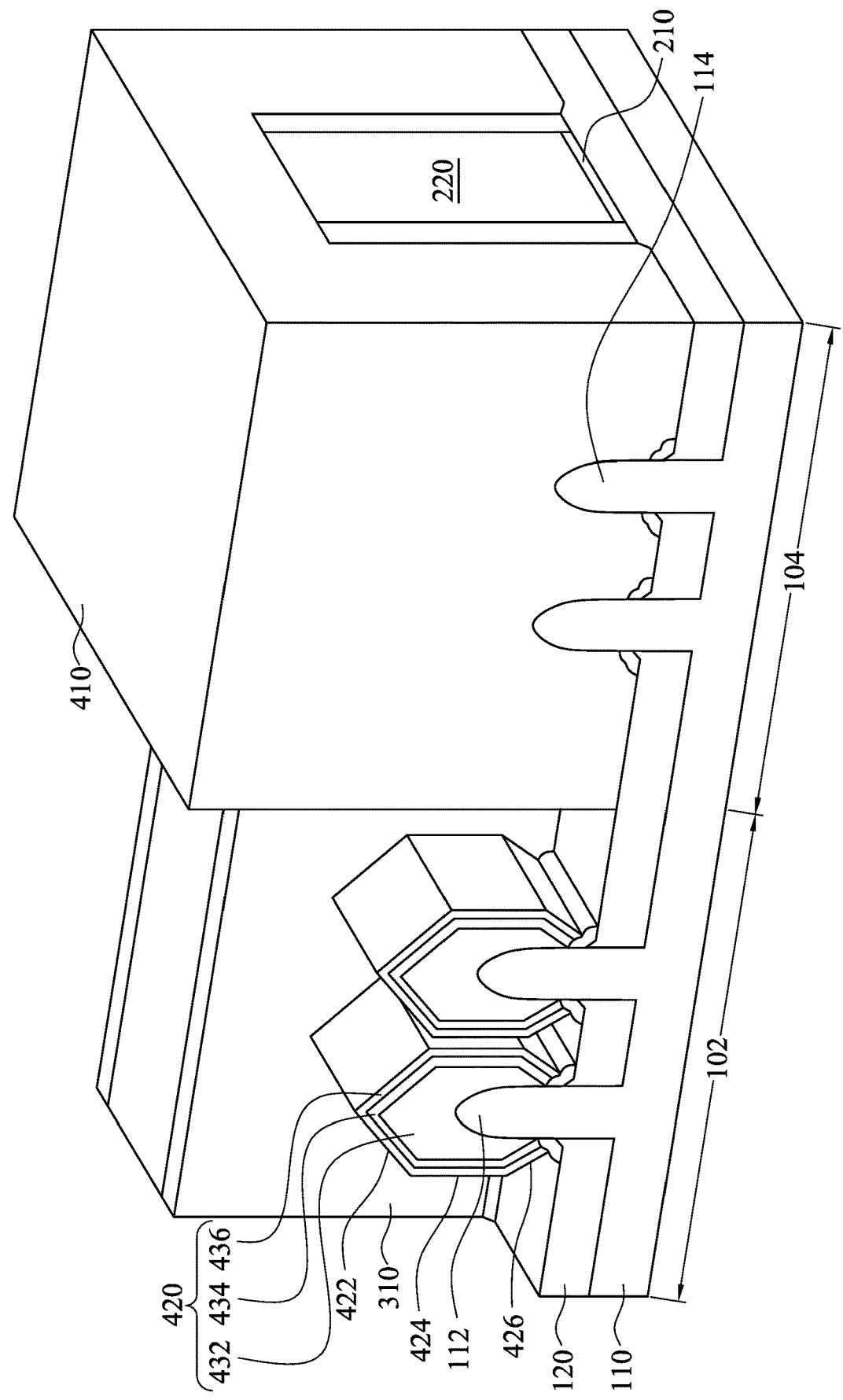

Reference is made to FIG. 4. A first mask layer 410 is formed over the second region 104 of the substrate 110 while the first region 102 of the substrate 110 is exposed. That is, the semiconductor fins 112 are uncovered by the first mask layer 410 while the semiconductor fins 114 are covered by the first mask layer 410. First epitaxial structures 420 are then formed on portions of the semiconductor fins 112 uncovered by the dummy gate structure 220, the spacer structures 310, and the first mask layer 410 by performing, for example, a selectively growing process. The first epitaxial structures 420 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The first epitaxial structures 420 have suitable crystallographic orientations (e.g., (110) and (111) crystallographic orientations), such that the first epitaxial structures 420 have hexagon cross sections. For example, the top surfaces 422 and the bottom surfaces 426 of the first epitaxial structures 420 are (111) facets (i.e., top surfaces 422 are upward facing facets facing upwards, and the bottom surfaces 426 are downward facing facets facing downwards), and the sidewalls 424 of the first epitaxial structures 420 are (110) facets (sidewall facets). The first epitaxial structures 420 may be separated from each other as shown in FIG. 4 or be merged together. In some embodiments, the first epitaxial structures 420 are source/drain epitaxial structures. In some embodiments, where an N-type device is desired, the first epitaxial structures 420 may include an epitaxially growing silicon phosphorus (SiP) or silicon carbon (SiC). The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, the first epitaxial structures 420 includes a first epitaxial layer 432 formed on the semiconductor fin 112, a second epitaxial layer 434 formed on the first epitaxial layer 432, and a third epitaxial layer 436 formed on the second epitaxial layer 434. The first, second, and third epitaxial layers 432, 434, 436 are crystalline semiconductor layers, such as Si, SiC, SiCP, SiP, Ge and SiGe, having different lattice constants from each other and from the semiconductor fins 112. When SiC, SiP and/or SiCP are used, the C or P concentration of the first epitaxial layer 432 is different from that of the second and third epitaxial layers 434 and 436. In some embodiments, a Group III-V semiconductor layer is used for at least one of the first, second, and third epitaxial layers 432, 434, and 436. In some other embodiments, only one or two of the first, second, and third epitaxial layers 432, 434, and 436 is formed, and in some other embodiments, more epitaxial layers are formed.

Figure 5:
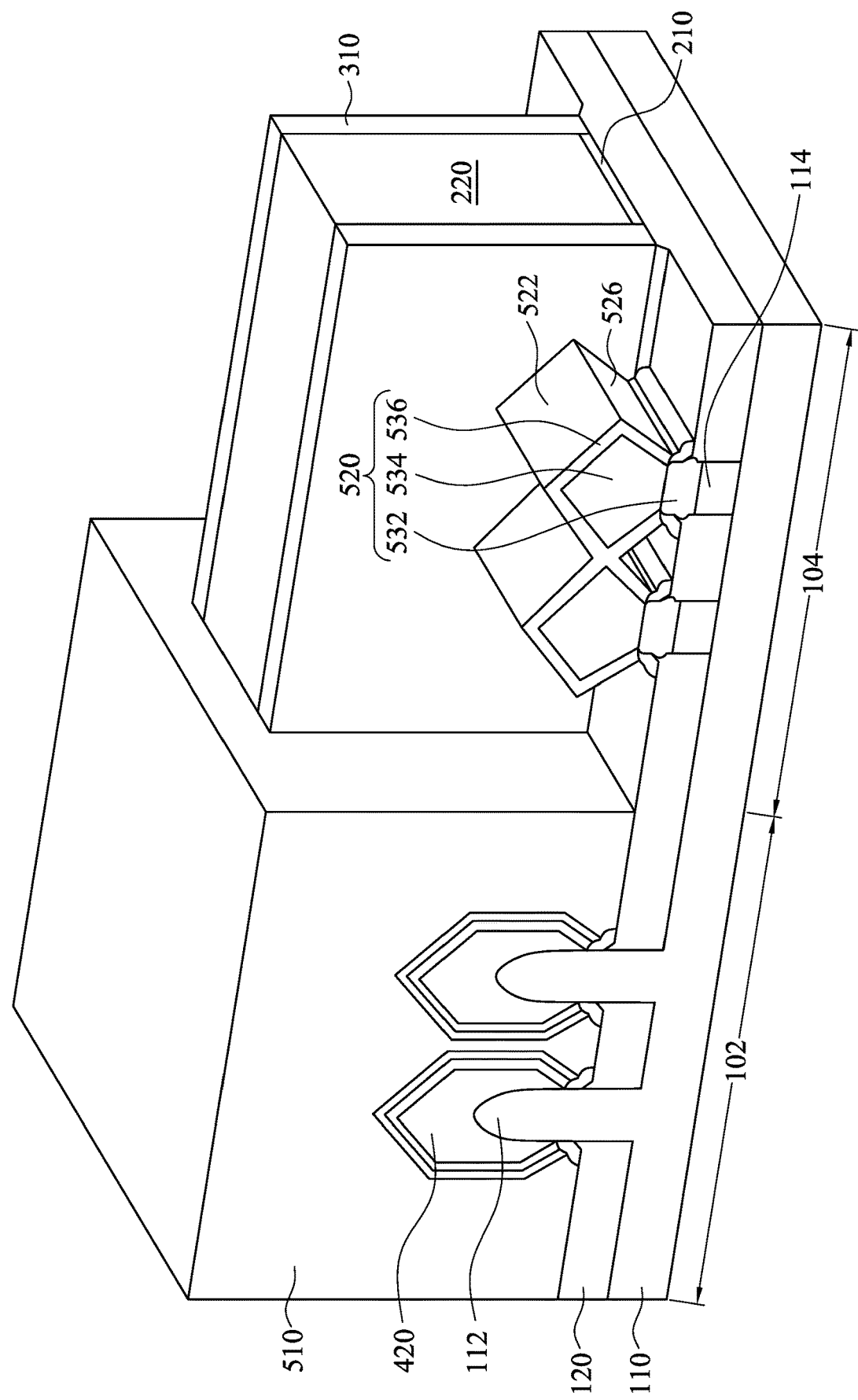

Reference is made to FIG. 5. The first mask layer 410 of FIG. 4 is removed, and a second mask layer 510 is formed over the first region 102 of the substrate 110 while the second region 104 of the substrate 110 is exposed. That is, the semiconductor fins 112 and the first epitaxial structures 420 are covered by the second mask layer 510 while the semiconductor fins 114 are uncovered by the second mask layer 510. Portions of the second fins 114 uncovered by the dummy gate structure 220 and the spacer structures 310 are recessed, and second epitaxial structures 520 are then formed on the recessed portion of the semiconductor fins 114 by performing, for example, a selectively growing process. The second epitaxial structures 520 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The second epitaxial structures 520 have suitable crystallographic orientations (e.g., a (100) crystallographic orientation), such that the second epitaxial structures 520 have diamond cross sections. In some embodiments, the top surfaces 522 and the bottom surfaces 526 of the second epitaxial structures 520 are (100) facets (i.e., top surfaces 522 are upward facing facets facing upwards, and the bottom surfaces 526 are downward facing facets facing downwards). The second epitaxial structures 520 may be merged together as shown in FIG. 5 or be separated from each other. In some embodiments, the second epitaxial structures 520 include source/drain epitaxial structures. In some embodiments, where a P-type device is desired, the second epitaxial structures 520 may include an epitaxially growing silicon germanium (SiGe). The first epitaxial structures 420 and the second epitaxial structures 520 have different conductivity types. The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, the second epitaxial structures 520 includes a fourth epitaxial layer 532 formed on the semiconductor fin 114, a fifth epitaxial layer 534 formed on the fourth epitaxial layer 532, and a sixth epitaxial layer 536 formed on the fifth epitaxial layer 534. The fourth, fifth, and sixth epitaxial layers 532, 534, and 536 are crystalline semiconductor layers, such as Si, SiC, SiCP, SiP, Ge and SiGe, having different lattice constants from each other and from the semiconductor fins 114. When SiGe are used, the Ge concentration of the fourth epitaxial layer 532 is different from that of the fifth and sixth epitaxial layers 534 and 536. In some embodiments, a Group III-V semiconductor layer is used for at least one of the fourth, fifth, and sixth epitaxial layers 532, 534, 536. In some other embodiments, only one or two of the fourth, fifth, and sixth epitaxial layers 532, 534, and 536 is formed, and in some other embodiments, more epitaxial layers are formed.

Figure 6:
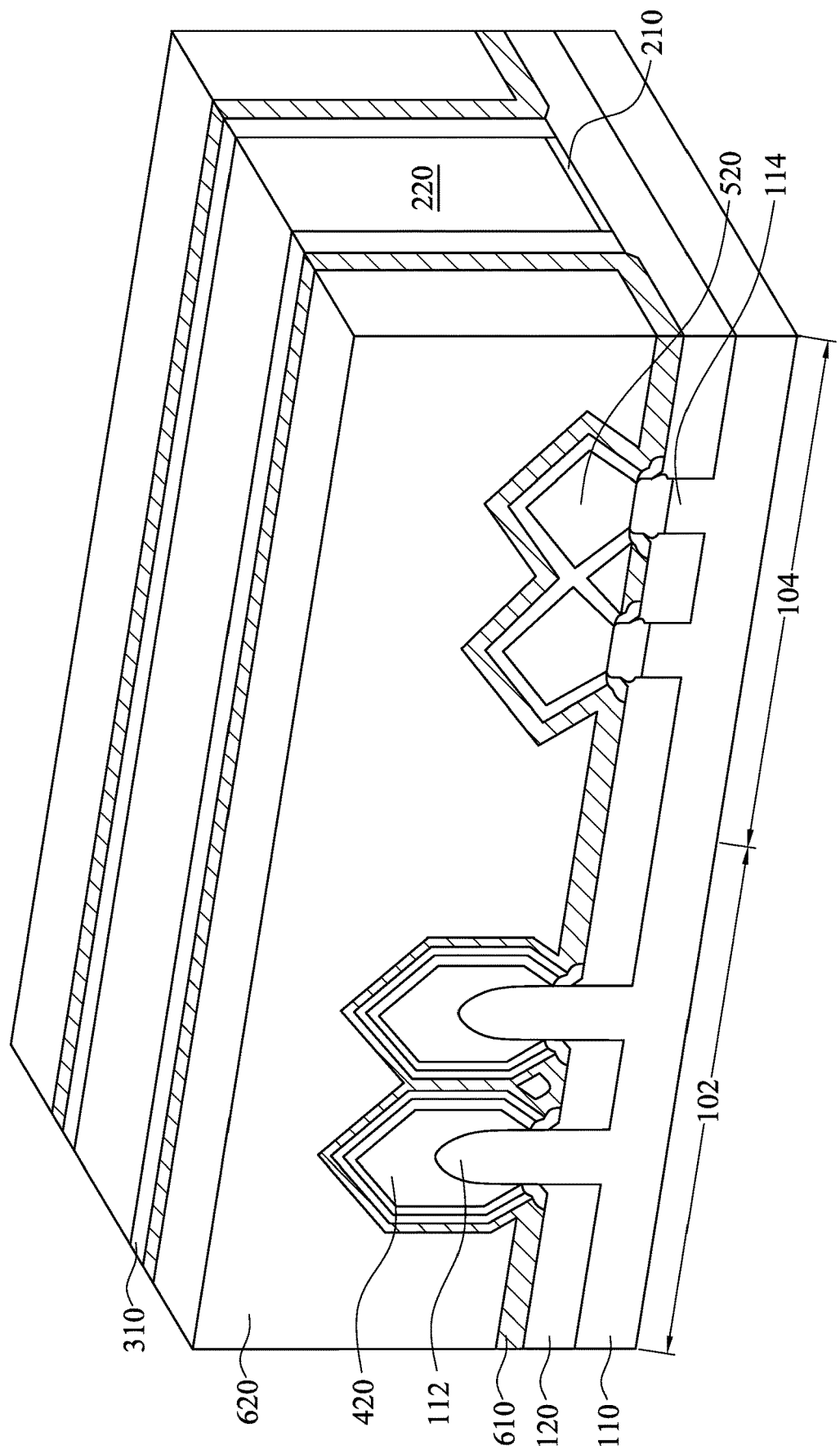

Reference is made to FIG. 6. The second mask layer 510 of FIG. 5 is removed. A first contact etch stop layer (CESL) 610 is then conformally formed over the first epitaxial structures 420, the second epitaxial structures 520, the dummy gate structure 220, the spacer structures 310, and the isolation structure 120. In some embodiments, the CESL 610 is not formed under the merged portion of the second epitaxial structures 520. In some embodiments, the first CESL 610 can be a stressed layer or layers. In some embodiments, the first CESL 610 has a tensile stress and is formed of $Si_3N_4$. In some other embodiments, the first CESL 610 includes materials such as oxynitrides. In yet some other embodiments, the first CESL 610 may have a composite structure including a plurality of layers, such as a silicon nitride layer overlying a silicon oxide layer. The first CESL 610 can be formed using plasma enhanced CVD (PECVD), however, other suitable methods, such as low pressure CVD (LPCVD), atomic layer deposition (ALD), and the like, can also be used.

A first interlayer dielectric (ILD) 620 is then formed on the first CESL 610. The first ILD 620 may be formed by chemical vapor deposition (CVD), high-density plasma CVD, spin-on, sputtering, or other suitable methods. In some embodiments, the first ILD 620 includes silicon oxide. In some other embodiments, the first ILD 620 may include silicon oxy-nitride, silicon nitride, or a low-k material. Then, a planarization process, such as a chemical mechanical planarization (CMP) process, is performed to planarize the first CESL 610 and the first ILD 620 to expose the dummy gate structure 220.

Figure 7:
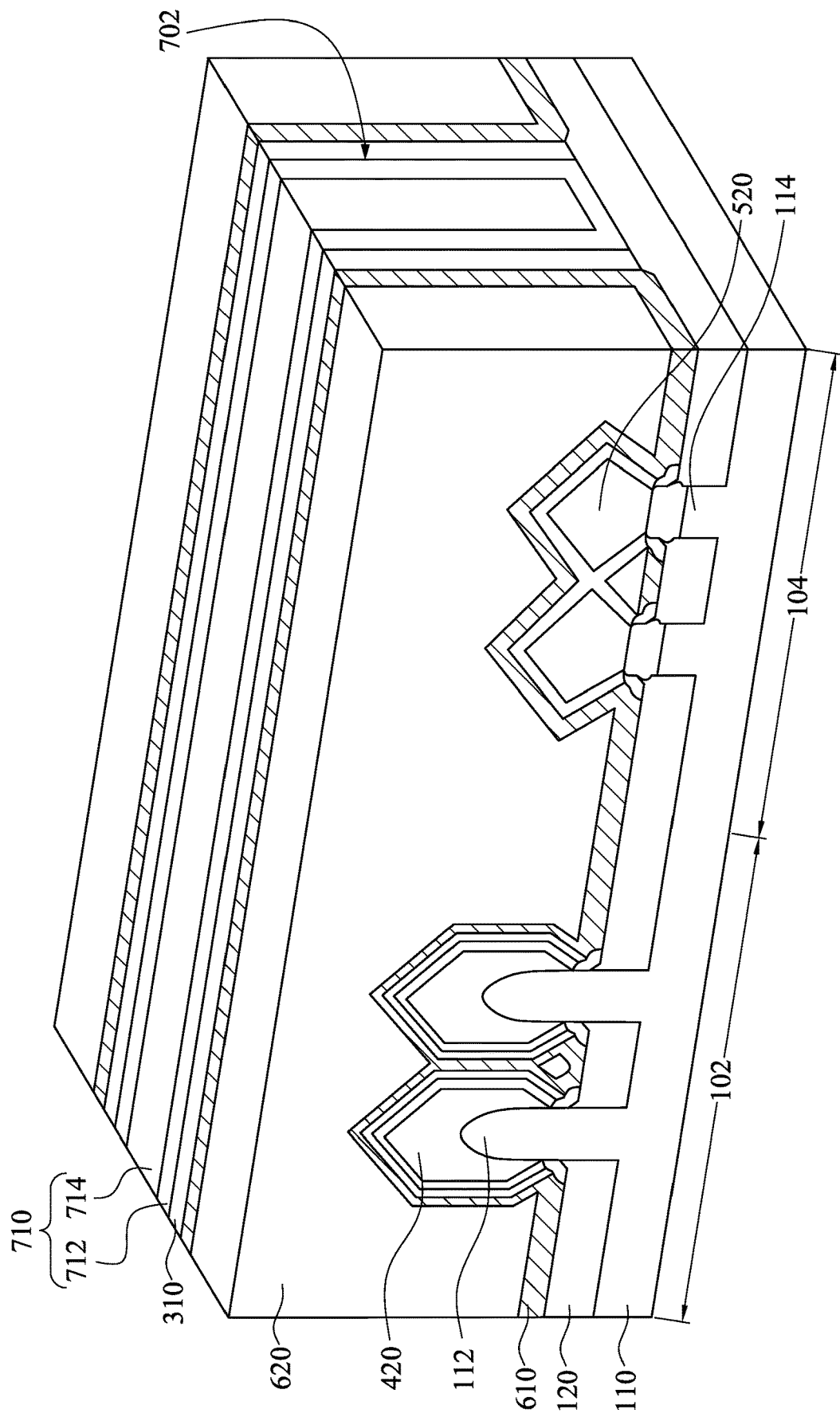

Reference is made to FIG. 7. A replacement gate (RPG) process scheme is employed. In the RPG process scheme, a dummy polysilicon gate (the dummy gate structure 220 (see FIG. 6) in this case) is formed in advance and is replaced later by a metal gate. In some embodiments, the dummy gate structure 220 is removed to form an opening 702 with the spacer structures 310 as its sidewalls. In some other embodiments, the dummy dielectric layer 210 (see FIG. 6) is removed as well. Alternatively, in some embodiments, the dummy gate structure 220 is removed while the dummy dielectric layer 210 retains. The dummy gate structure 220 (and the dummy dielectric layer 210) may be removed by dry etch, wet etch, or a combination of dry and wet etch.

A gate dielectric layer 712 is conformally formed in the opening 702. The gate dielectric layer 712 is over the semiconductor fins 112 and/or 114. The gate dielectric layer 712 can be a high-κ dielectric layer having a dielectric constant (κ) higher than the dielectric constant of $SiO_2$, i.e. κ>3.9. The gate dielectric layer 712 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable materials. The gate dielectric layer 712 is deposited by suitable techniques, such as ALD, CVD, PVD, thermal oxidation, combinations thereof, or other suitable techniques.

At least one metal layer is formed in the opening 702 and on the gate dielectric layer 712. Subsequently, a chemical mechanical planarization (CMP) process is performed to planarize the metal layer and the gate dielectric layer 712 to form metal gate stack 710 in the opening 702. The metal gate stack 710 crosses over the semiconductor fins 112 and/or 114. The metal gate stack 710 includes the gate dielectric layer 712 and a metal gate electrode 714 over the gate dielectric layer 712. The metal gate electrode 714 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, other suitable p-type work function materials, or combinations thereof. The work function metal layer may have multiple layers. The work function metal layer(s) may be deposited by CVD, PVD, electroplating and/or other suitable process. In some embodiments, the metal gate electrode 714 is a p-type metal gate including a p-type work function metal layer. In some embodiments, the capping layer in the metal gate electrodes 714 may include refractory metals and their nitrides (e.g. TiN, TaN, $W_2N$, TiSiN, TaSiN). The capping layer may be deposited by PVD, CVD, metal-organic chemical vapor deposition (MOCVD), ALD, or the like. In some embodiments, the fill layer in the metal gate electrodes 714 may include tungsten (W). The fill layer may be deposited by ALD, PVD, CVD, or other suitable process.

Figure 8A:
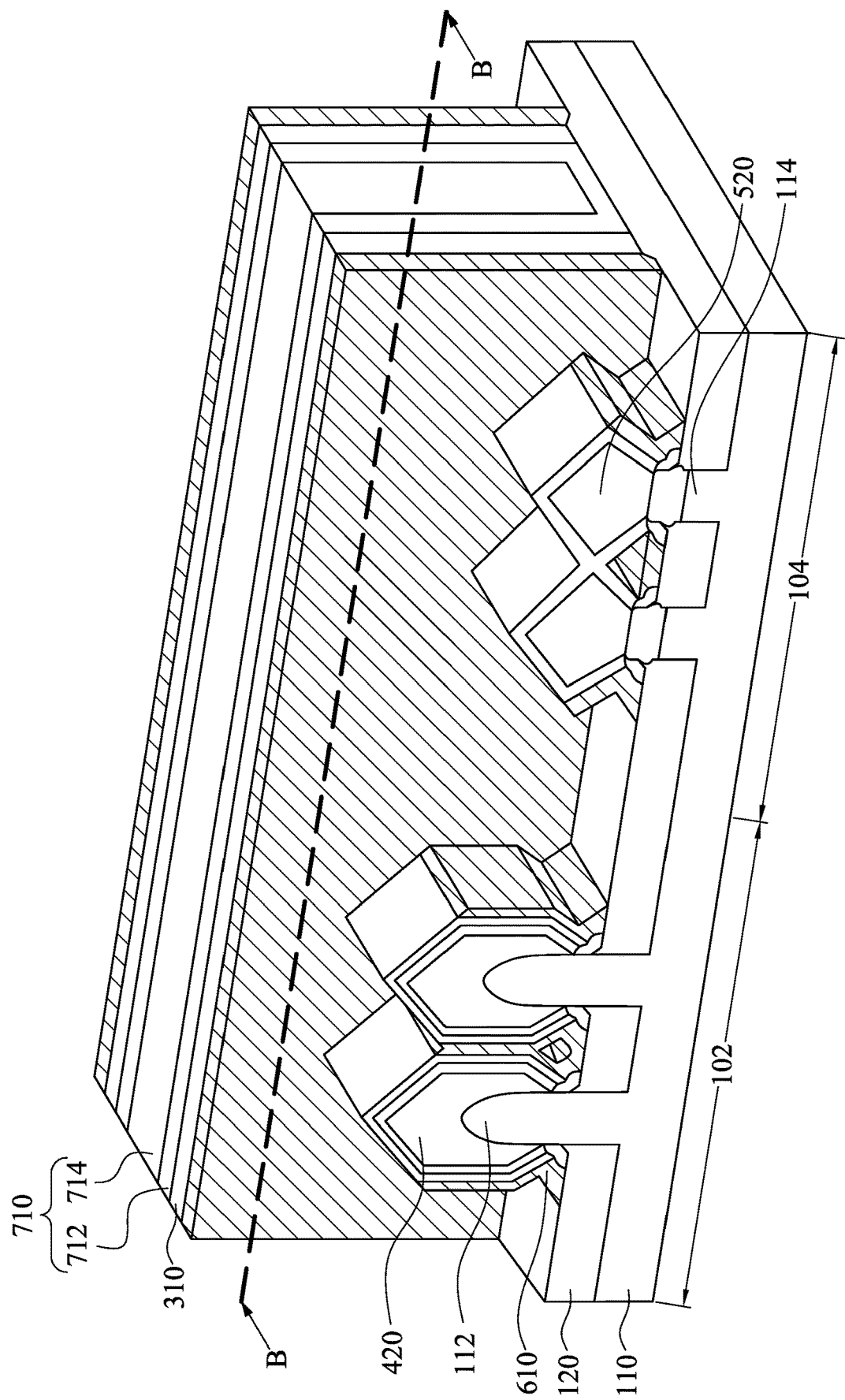
Figure 8B:
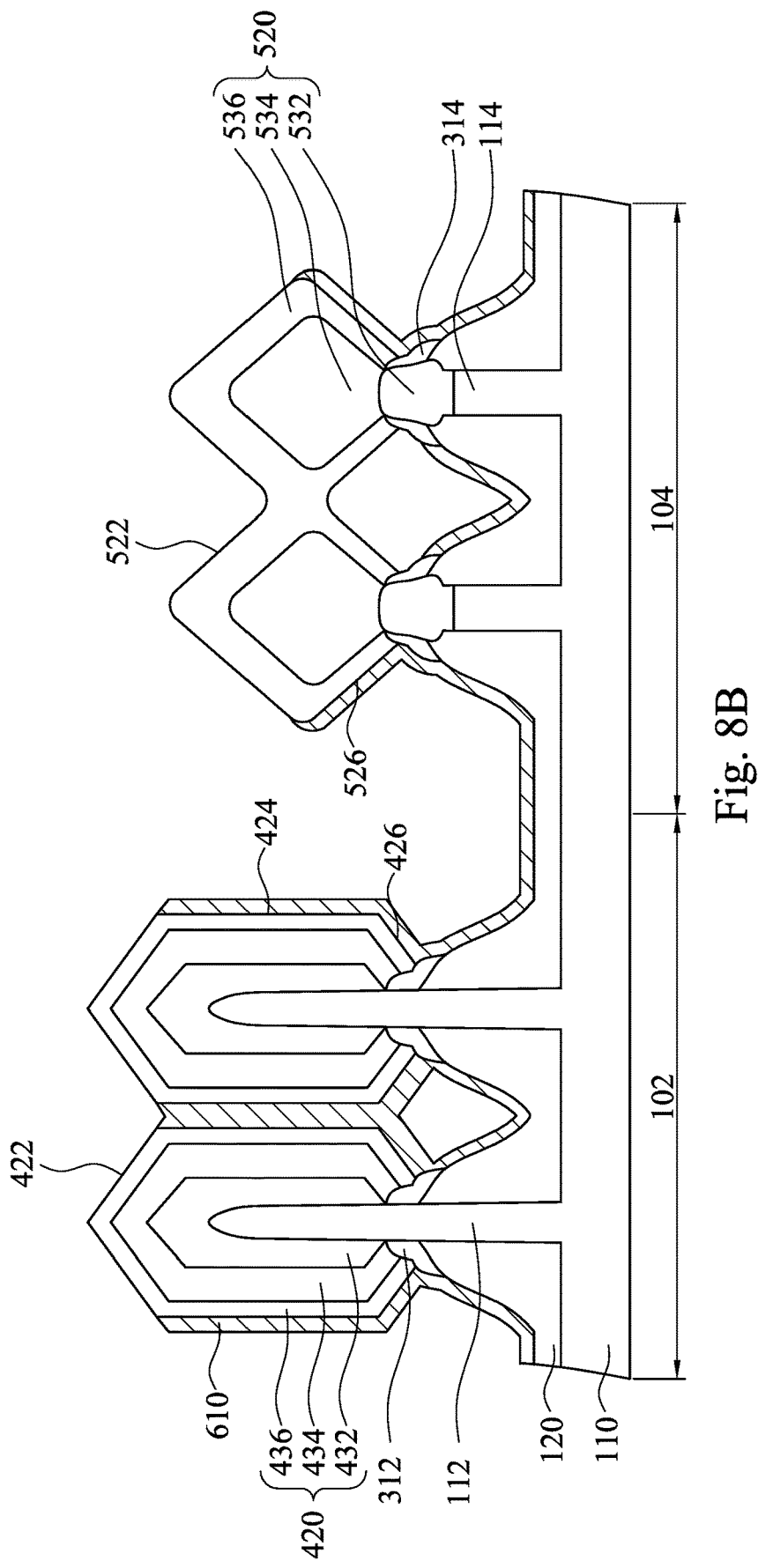

Reference is made to FIGS. 8A and 8B. FIG. 8B is a cross-sectional view taken along line B-B of FIG. 8A. The first ILD 620 of FIG. 7 is removed to expose the first CESL 610. In some embodiments, the first ILD 620 is fully removed. In some other embodiments, the first ILD 620 is partially removed from areas around the first epitaxial structures 420 and the second epitaxial structures 520. Then, portions of the first CESL 610 over the first epitaxial structures 420 and the second epitaxial structures 520 are removed to expose the top surfaces 422 of the first epitaxial structures 420 and the top surfaces 522 of the second epitaxial structures 520. The sidewalls 424 and the bottom surfaces 426 of the first epitaxial structures 420 and the bottom surfaces 526 of the second epitaxial structures 520 are still covered by the CESL 610. In some embodiments, the first CESL 610 is anisotropic etched by performing, for example, a reactive ion etch (RIE) process or other suitable processes. Anisotropic etching means different etch rates in different directions in the material. That is, an anisotropic etching removes the material being etched at different rates in different directions. For example, in FIGS. 8A and 8B, the anisotropic etching removes the horizontal portions of the first CESL 610 faster than the vertical portions thereof. As such, the portions of the first CESL 610 over the top surfaces 422 and 522 are removed and other portions of the first CESL 610 remains. Furthermore, the portions of the CESL 610 over the isolation structures 120 are also removed in this stage.

Figure 9:
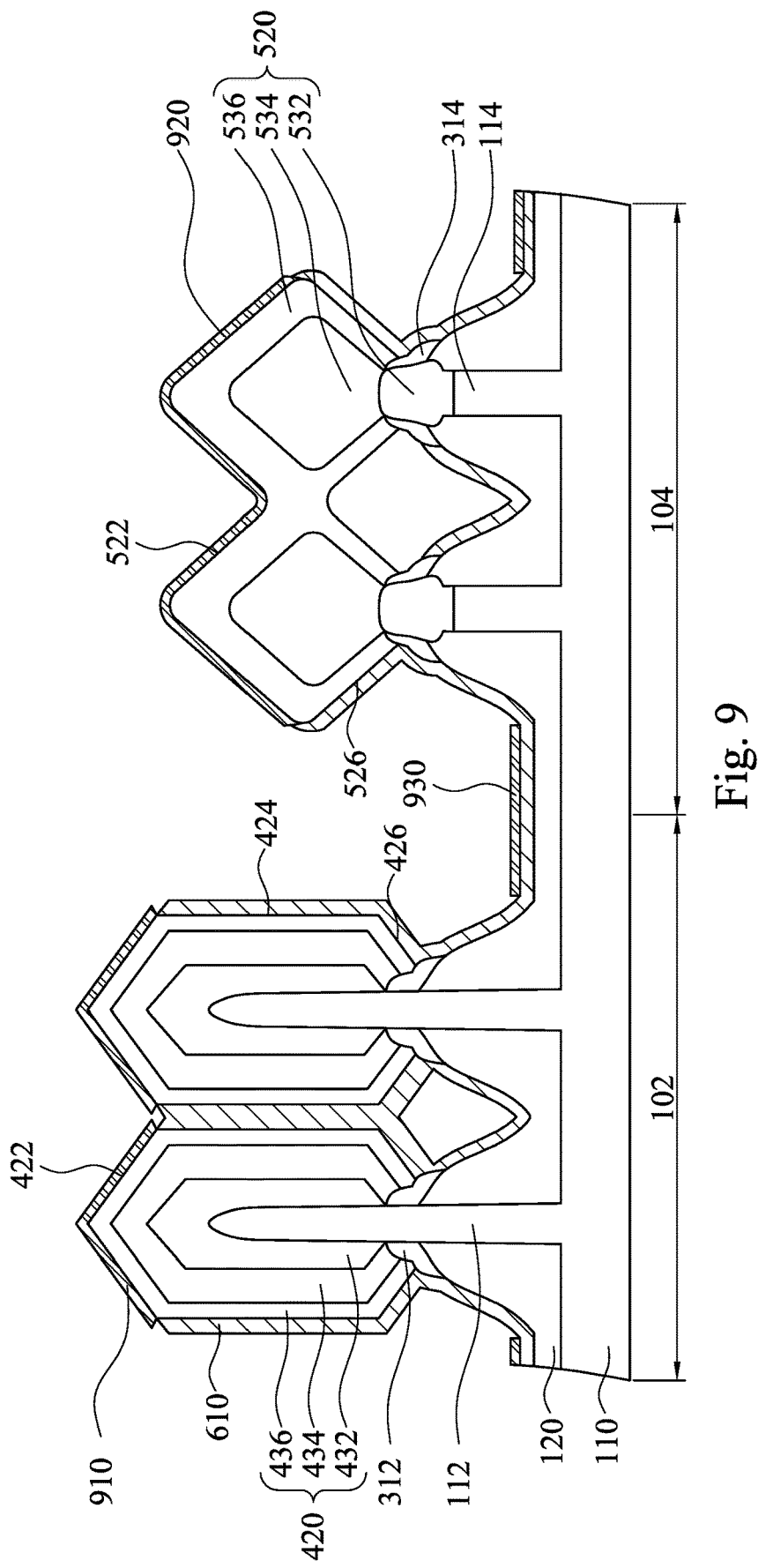

Reference is made to FIG. 9. FIG. 9 is taken along the same line as FIG. 8B. A metal material is directionally (or anisotropically) formed over the structure of FIG. 8B, such that a first metal layer 910 and a second metal layer 920 are respectively formed over the top surfaces 422 and 522. The anisotropic deposition method employed to deposit the metal material can be methods that provide a directional deposition so that more metal material is deposited on horizontal surfaces than on vertical surfaces. For example, the anisotropic deposition method can be a collimated physical vapor deposition (PVD) method, in which the metal material is directed downward in directions substantially parallel to the vertical direction of the exemplary semiconductor structure. The term "substantially" as used herein may be applied to modify any quantitative representation which could permissibly vary without resulting in a change in the basic function to which it is related. Alternately, the anisotropic deposition method can employ radio frequency physical vapor deposition (RFPVD) sputtering and/or with constant voltage substrate bias, i.e., constant electrical voltage bias applied to the substrate. Also, the anisotropic deposition method may be an ion CVD, or other suitable processes. The deposition rate depends on the angle of incidence of incoming particles, resulting in a higher deposition rate on the top surfaces 422 than surfaces of the first CESL 610. Hence, the first metal layer 910 is in contact with the top surfaces 422 and not in contact with other surfaces of the first epitaxial structures 420, and the second metal layer 920 is in contact with the top surfaces 522 and not in contact with other surfaces of the second epitaxial structures 520. In some embodiments, portions of the metal material are formed over the isolation structures 120 to form an excess metal layer 930. The metal material (i.e., the first metal layer 910, the second metal layer 920, and the excess metal layer 930) is made of Ni, Co, Pt, W, Ru, combinations thereof, or other suitable materials. The first metal layer 910 and the second metal layer 920 have high work function, for example, in a range from about 4.4 eV to about 5.2 eV.

Figure 10:
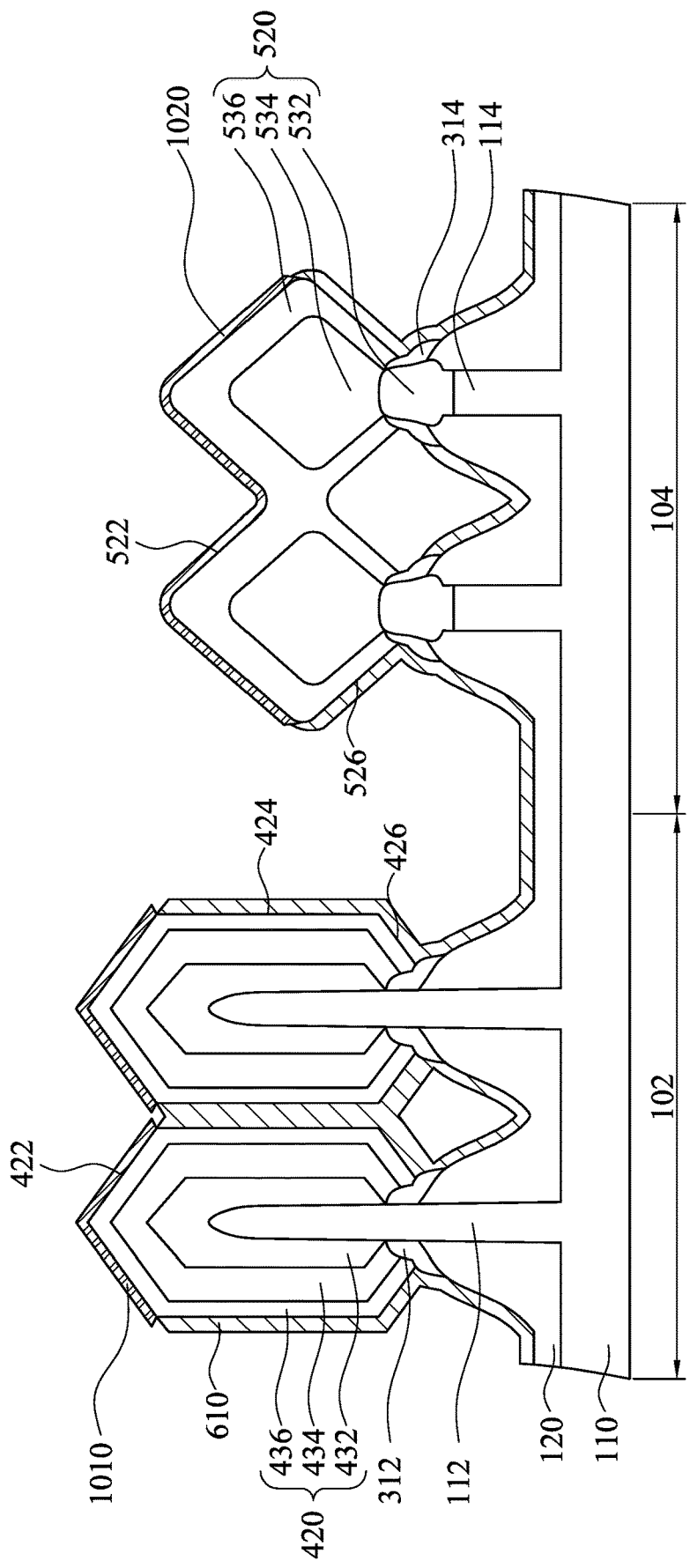

Reference is made to FIG. 10. An annealing process is performed on the first metal layer 910 (see FIG. 9), the second metal layer 920 (see FIG. 9), the first epitaxial structures 420, and the second epitaxial structures 520 to form a first top metal alloy layer 1010 and a second top metal alloy layer 1020 respectively. The annealing process is also referred to as a silicide process if the first epitaxial structures 420 and the second epitaxial structures 520 are made of silicon. The silicide process converts the surface portions of the first epitaxial structures 420 and the second epitaxial structures 520 into silicide contacts (i.e., the first top metal alloy layer 1010 and the second top metal alloy layer 1020 in this case). Silicide processing involves deposition of a metal material (i.e., the first metal layer 910 and the second metal layer 920 in this case) that undergoes a silicidation reaction with silicon (Si). In order to form silicide contacts on the first epitaxial structures 420 and the second epitaxial structures 520, the first metal layer 910 and the second metal layer 920 are respectively blanket deposited on the top surfaces 422 of the first epitaxial structures 420 and the top surfaces 522 of the second epitaxial structures 520. After heating the wafer to a temperature at which the metal reacts with the silicon of the first epitaxial structures 420 and the second epitaxial structures 520 to form contacts, unreacted metal (such as the excess metal layer 930 of FIG. 9) is removed. The silicide contacts remain over the first epitaxial structures 420 and the second epitaxial structures 520, while unreacted metal is removed from other areas.

Figure 11:
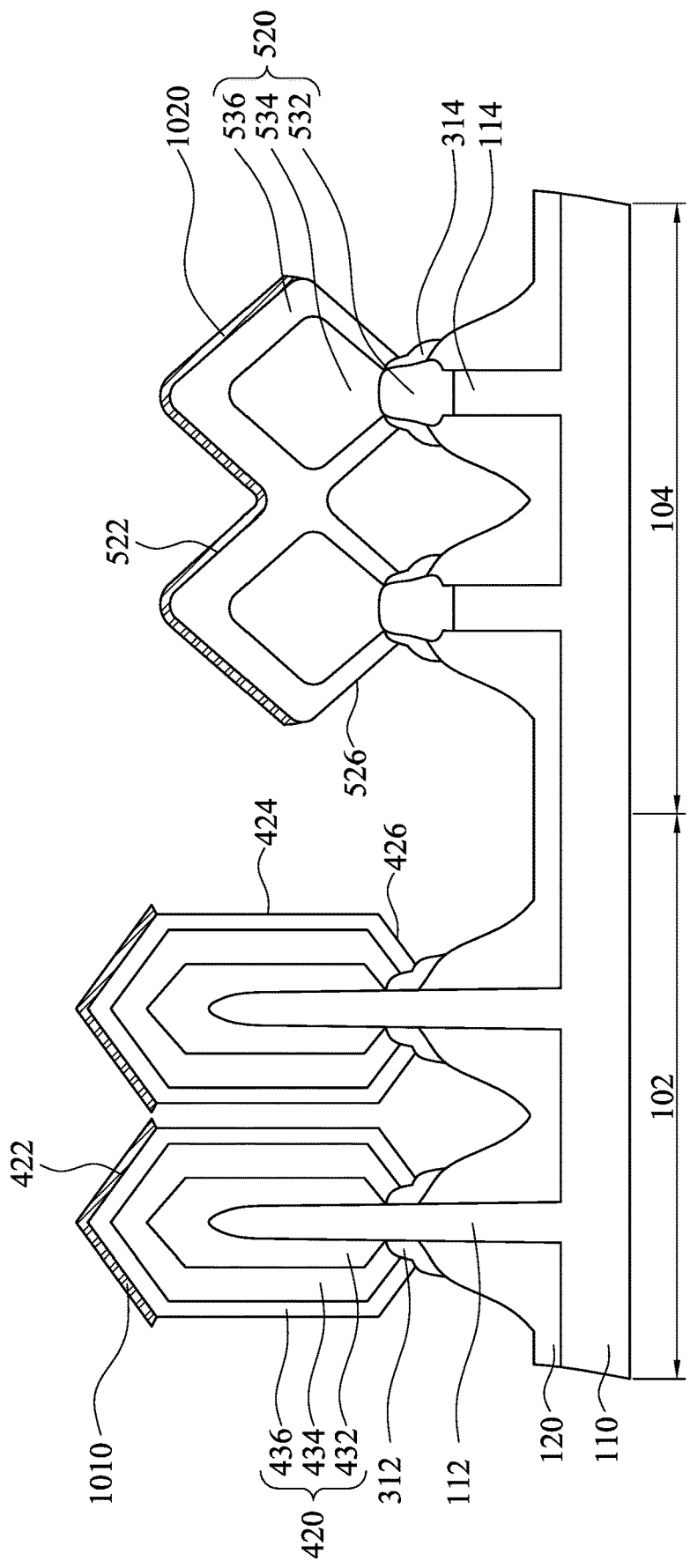

Reference is made to FIG. 11. The remaining first CESL 610 of FIG. 10 is removed, such that the sidewalls 424 and the bottom surfaces 426 of the first epitaxial structures 420 and the bottom surfaces 526 of the second epitaxial structures 520 are exposed. Moreover, the top surfaces 422 are covered by the first top metal alloy layer 1010 and the top surfaces 522 are covered by the second top metal alloy layer 1020. In some embodiments, the first CESL 610 is isotropic etched by performing, for example, a wet chemical etching process or other suitable processes. An "isotropic etching" is an etching process that is not a directional etching. An isotropic etching removes the material being etched at the substantially same rate in each direction. That is, isotropic etching does not etch in a single direction, but rather etches horizontally as well as vertically into the first CESL 610.

Figure 12:
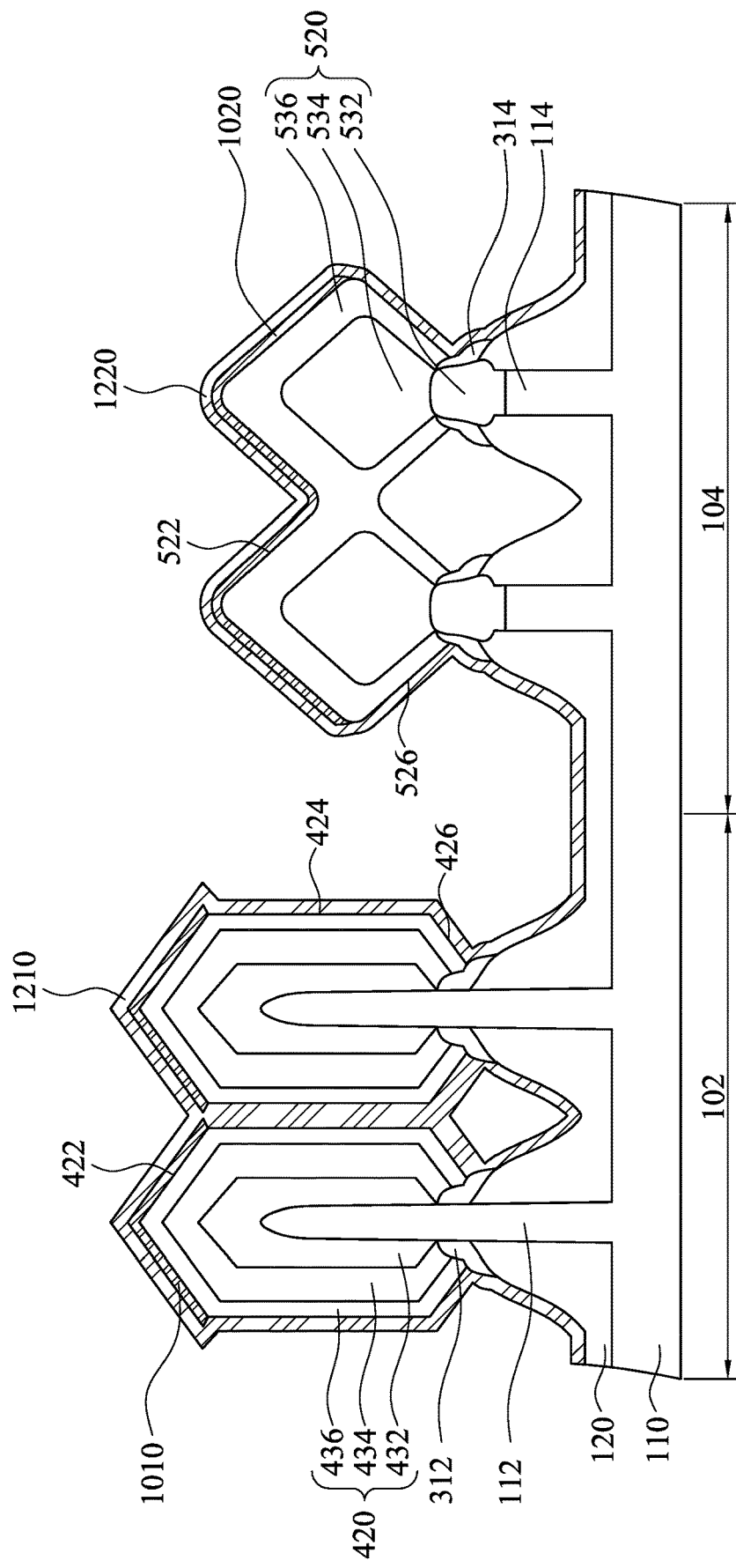

Reference is made to FIG. 12. Another metal material is conformally (or non-directionally) formed over the structure of FIG. 11, such that a third metal layer 1210 and a fourth metal layer 1220 are respectively formed on the first epitaxial structures 420 and the second epitaxial structures 520. That is, the third metal layer 1210 is in contact with the first top metal alloy layer 1010 and the sidewalls 424 and the bottom surfaces 426 of the first epitaxial structures 420, and the fourth metal layer 1220 is in contact with the second top metal alloy layer 1020 and the bottom surfaces 526 of the second epitaxial structures 520. In some embodiments, the fourth metal layer 1220 is not formed under the merged portion of the second epitaxial structures 420. The third metal layer 1210 and the fourth metal layer 1220 are made of Ti, Er, Y, Yb, Eu, Tb, Lu, Th, Sc, Hf, Zr, Ta, combinations thereof, or other suitable materials. The third metal layer 1210 and the fourth metal layer 1220 have low work function, for example, in a range from about 2.5 eV to about 4.4 eV. That is, the third metal layer 1210 and the fourth metal layer 1220 have a work function lower than that of the first metal layer 910 and the second metal layer 920 as shown in FIG. 9. The third metal layer 1210 and the fourth metal layer 1220 are formed by performing a conformally (or isotropic) deposition process, such as PECVD, PEALD, or other suitable processes. That is, the metal material is deposited over not only one direction, but different directions of the first epitaxial structures 420 and the second epitaxial structures 520.

Figure 13:
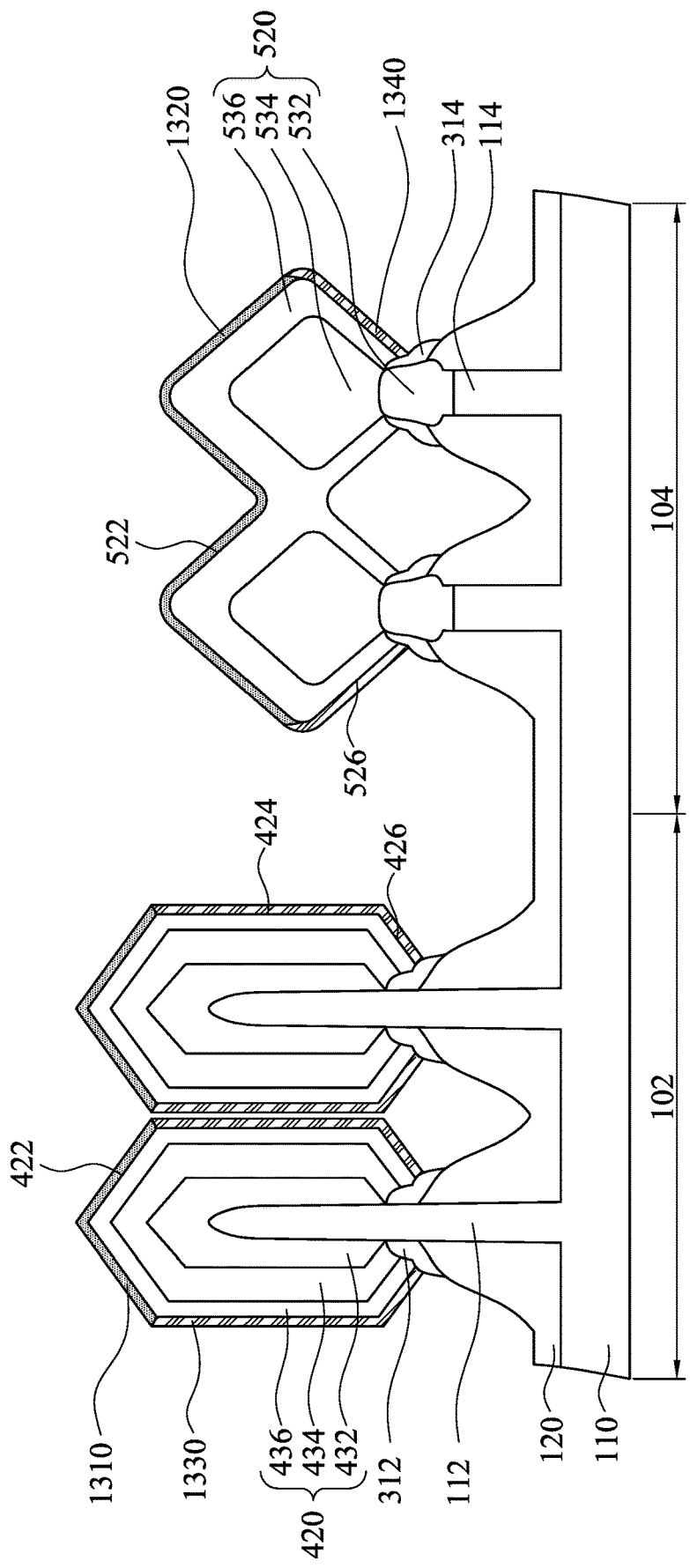

Reference is made to FIG. 13. Another annealing process is performed on the first top metal alloy layer 1010 (see FIG. 12), the second top metal alloy layer 1020 (see FIG. 12), the third metal layer 1210 (see FIG. 12), the fourth metal layer 1220 (see FIG. 12), the first epitaxial structures 420, and the second epitaxial structures 520. The first top metal alloy layer 1010, the third metal layer 1210, and the first epitaxial structures 420 are annealed to form a third top metal alloy layer 1310, the second top metal alloy layer 1020, the fourth metal layer 1220, and the second epitaxial structures 520 are annealed to form a fourth top metal alloy layer 1320, the third metal layer 1210 and the first epitaxial structures 420 are annealed to form a first bottom metal alloy layer 1330, and the fourth metal layer 1220 and the second epitaxial structures 520 are annealed to form a second bottom metal alloy layer 1340. The annealing process is also referred to as a silicide process if the first epitaxial structures 420 and the second epitaxial structures 520 are made of silicon. After the annealing process, the unreacted metal is removed. The third top metal alloy layer 1310 is in contact with the top surfaces 422 of the first epitaxial structures 420, the fourth top metal alloy layer 1320 is in contact with the top surfaces 522 of the second epitaxial structures 520, the first bottom metal alloy layer 1330 is in contact with the sidewalls 424 and the bottom surfaces 426 of the first epitaxial structures 420, and the second bottom metal alloy layer 1330 is in contact with the bottom surfaces 526 of the second epitaxial structures 520.

In some embodiments, the third top metal alloy layer 1310 and the fourth top metal alloy layer 1320 include the high WF metals including Ni, Co, Pt, W, Ru, or combinations thereof and the low WF metals including Ti, Er, Y, Yb, Eu, Tb, Lu, Th, Sc, Hf, Zr, Tb, Ta, or combination thereof, and the first bottom metal alloy layer 1330 and the second bottom metal alloy layer 1340 include the low WF metals including Ti, Er, Y, Yb, Eu, Tb, Lu, Th, Sc, Hf, Zr, Tb, Ta, or combinations thereof. As such, the third top metal alloy layer 1310 and the fourth top metal alloy layer 1320 have higher work function than the first bottom metal alloy layer 1330 and the second bottom metal alloy layer 1340. For the first epitaxial structures 420, the contact areas between the first bottom metal alloy layer 1330 and the first epitaxial structures 420 is larger than the contact areas between the third top metal alloy layer 1310 and the first epitaxial structures 420, such that the equivalent work function of the source/drain feature of N-type device (i.e., the first epitaxial structures 420, the first bottom metal alloy layer 1330, and the third top metal alloy layer 1310 in this case) is between the work functions of the first bottom metal alloy layer 1330 and the third top metal alloy layer 1310 but close to the first bottom metal alloy layer 1330. For the second epitaxial structures 520, the contact areas between the fourth top metal alloy layer 1320 and the second epitaxial structures 520 is larger than the contact areas between the second bottom metal alloy layer 1340 and the second epitaxial structures 520, such that the equivalent work function of the source/drain feature of P-type device (i.e., the second epitaxial structures 520, the second bottom metal alloy layer 1340, and the fourth top metal alloy layer 1320 in this case) is between the work functions of the second bottom metal alloy layer 1340 and the fourth top metal alloy layer 1320 but close to the fourth top metal alloy layer 1320. Therefore, the source/drain features of N-type and P-type devices have different work functions. In some embodiments, the third top metal alloy layer 1310 has a thickness in a range from about 2 nm to about 7 nm, the fourth top metal alloy layer 1320 has a thickness in a range from about 2 nm to about 7 nm, the first bottom metal alloy layer 1330 has a thickness in a range from about 2 nm to about 6 nm, and the second bottom metal alloy layer 1340 has a thickness in a range from about 2 nm to about 6 nm. If the thicknesses of the layers 1310, 1320, 1330, and 1340 are too small, such as less than about 2 nm, the schottky barrier of the source/drain features is affected, and the electrical properties of the source/drain features become worse.

Figure 14:
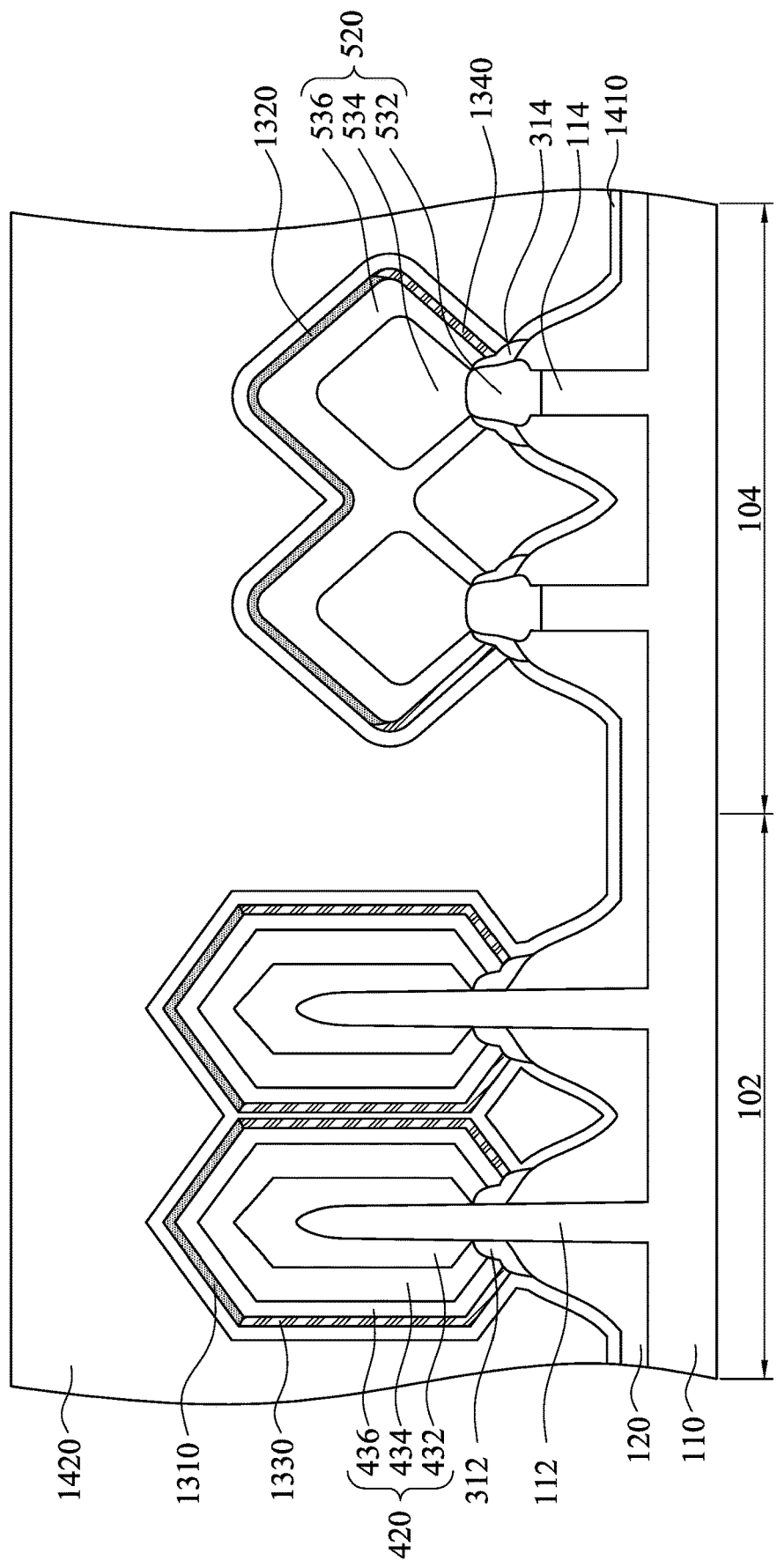

Reference is made to FIG. 14. A second contact etch stop layer (CESL) 1410 is conformally formed over the structure of FIG. 13. In some embodiments, the CESL 1410 is not formed under the merged portion of the second epitaxial structures 520. In some embodiments, the second CESL 1410 can be a stressed layer or layers. In some embodiments, the second CESL 1410 has a tensile stress and is formed of Si₃N₄. In some other embodiments, the second CESL 1410 includes materials such as oxynitrides. In yet some other embodiments, the second CESL 1410 may have a composite structure including a plurality of layers, such as a silicon nitride layer overlying a silicon oxide layer. The second CESL 1410 can be formed using plasma enhanced CVD (PECVD), however, other suitable methods, such as low pressure CVD (LPCVD), atomic layer deposition (ALD), and the like, can also be used.

A second interlayer dielectric (ILD) 1420 is then formed on the second CESL 1410. The second ILD 1420 may be formed by chemical vapor deposition (CVD), high-density plasma CVD, spin-on, sputtering, or other suitable methods. In some embodiments, the second ILD 1420 includes silicon oxide. In some other embodiments, the second ILD 1420 may include silicon oxy-nitride, silicon nitride, or a low-k material.

Figure 15:
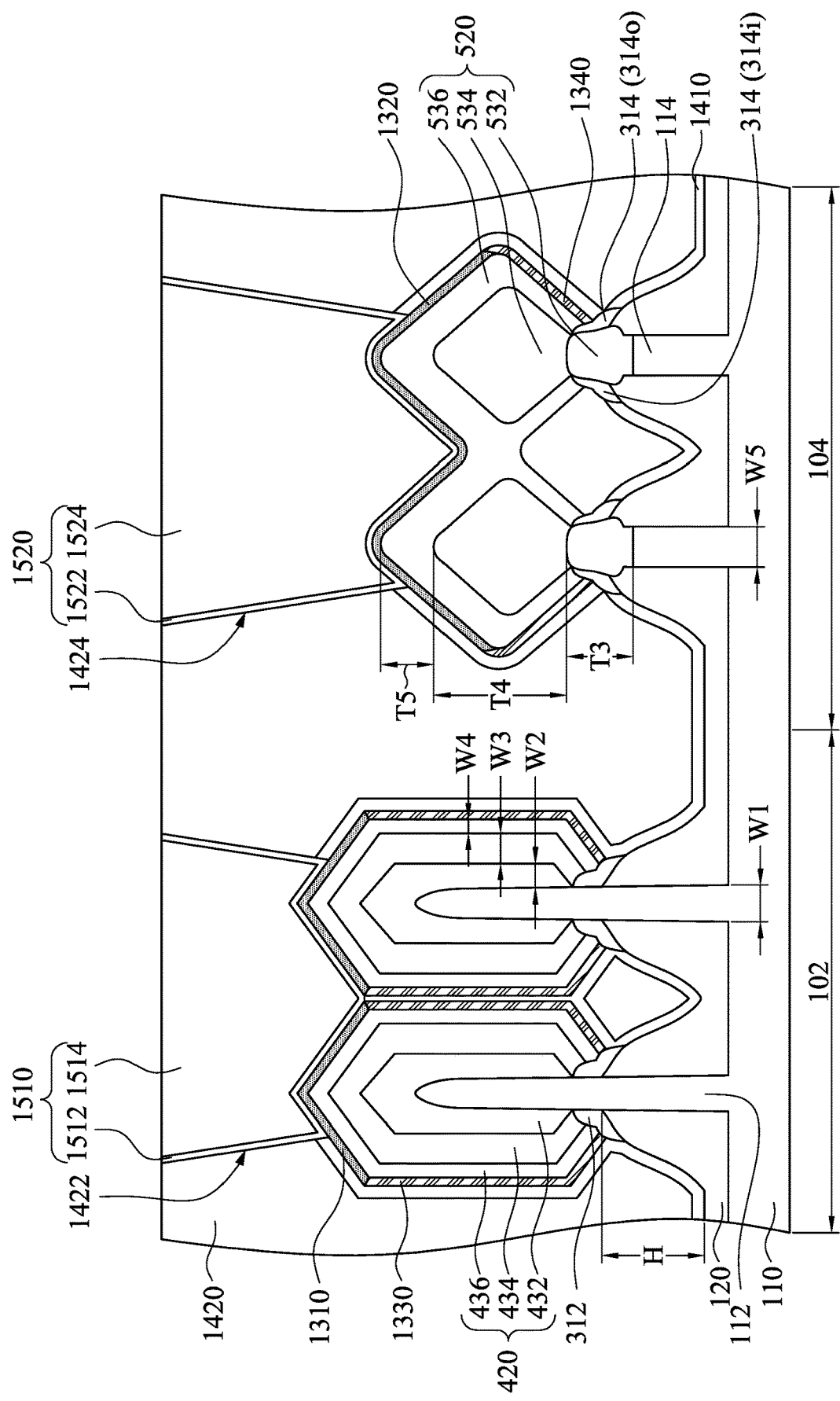

Reference is made to FIG. 15. The second ILD 1420 and the second CESL 1410 are partially removed to form a plurality of openings 1422 and 1424 by various methods, including a dry etch, a wet etch, or a combination of dry etch and wet etch. The openings 1422 and 1424 extend through the second ILD 1420 and the second CESL 1410 and respectively expose the third top metal alloy layer 1310 and the fourth top metal alloy layer 1320.

Contacts 1510 and 1520 are respectively formed in the openings 1422 and 1424 and respectively over the third top metal alloy layer 1310 and the fourth top metal alloy layer 1320. The contacts 1510 and 1520 are respectively and electrically connected to the first epitaxial structures 420 and the second epitaxial structures 520. The contact 1510 includes a barrier layer 1512 and a filling material 1514 formed over the barrier layer 1512. The contact 1520 includes a barrier layer 1522 and a filling material 1524 formed over the barrier layer 1522. In some embodiments, metal materials can be filled in the openings 1422 and 1424, and excessive portions of the metal materials are removed by performing a planarization process to form the filling materials 1514 and 1524. In some embodiments, the barrier layers 1512 and 1522 may include one or more layers of a material such as, for example, titanium, titanium nitride, titanium tungsten or combinations thereof. In some embodiments, the filling materials 1514 and 1524 may be made of, for example, tungsten, aluminum, copper, or other suitable materials. In some embodiments, the depth of the contact 1510/1520 is in a range from about 15 nm to about 60 nm, depending on node and the semiconductor fin heights.

In FIG. 15, the third top metal alloy layers 1310 and the first bottom metal alloy layers 1330 are formed on the third epitaxial layer 436. The third top metal alloy layers 1310 and the first bottom metal alloy layers 1330 are formed by a reaction between the material of the third epitaxial layer 436 and metal layers formed thereon. The third epitaxial layer 436 of one of the first epitaxial structures 420 is separated from the third epitaxial layer 436 of the other one of the first epitaxial structure 420. In some embodiments, the first bottom metal alloy layers 1330 are separated from each other as shown in FIG. 15; in some other embodiments, the first bottom metal alloy layers 1330 fills the space between the two first epitaxial structures 420; in still some other embodiments, one or more void(s) and/or hole(s) is(are) formed in the first bottom metal alloy layers 1330 and between the two first epitaxial structures 420. The shapes of the voids in the cross section may include a rhombus, a circle, an oval, or an irregular shape. The shapes may be symmetry or asymmetric. The number of the voids may be as small as one in some embodiments, and more than one in some other embodiments. Sizes of the multiple voids and spaces between voids may be substantially the same or different.

In some embodiments, the semiconductor fin 112 has a width (thickness) W1 in a range from about 4 nm to about 10 nm; the first epitaxial layer 432 has a width (thickness) W2 in a range from about 0 nm to about 3 nm; the second epitaxial layer 434 has a width (thickness) W3 in a range from about 2 nm to about 8 nm; and the third epitaxial layer 436 has a width (thickness) W4 in a range from about 0 nm to about 3 nm.

Further, the fourth top metal alloy layers 1320 and the second bottom metal alloy layers 1340 are formed on the sixth epitaxial layer 536. The fourth top metal alloy layers 1320 and the second bottom metal alloy layers 1340 are formed by a reaction between the material of the sixth epitaxial layer 536 and metal layers formed thereon. As shown in FIG. 15, the sixth epitaxial layer 536 of one of the second epitaxial structures 520 is merged with the sixth epitaxial layer 536 of the other one of the second epitaxial structure 520.

In some embodiments, the fourth epitaxial layer 532 has a thickness (height) T3 in a range from about 0 nm to about 3 nm; the fifth epitaxial layer 534 has a thickness (height) T4 in a range from about 2 nm to about 8 nm; and the sixth epitaxial layer 536 has a thickness T5 in a range from about 0 nm to about 3 nm. Moreover, the width W5 of the fourth epitaxial layer 532 may be greater than, less than, or equal to the thickness T3 of the fourth epitaxial layer 532. For example, T3:W5=1:1.2 to 1:2 in some embodiments. In some embodiments, the space between two semiconductor fins 114 is greater than about 15 nm.

Furthermore, it is noted although in FIG. 15, the spacer residues 314 formed on opposite sides of the semiconductor fin 114 have the same height, the spacer residues 314 may have different heights in some other embodiments. For example, the spacer residue 314i formed between two semiconductor fins 114 is higher than the spacer residue 314i formed on opposite side of the semiconductor fins 114. This is because the dense space between the two semiconductor fins 114 results in slow etching rate during the etching operations in FIG. 3. In some embodiments, the difference between the spacer residues 314i and 314o is in a range from 0 nm to about 10 nm.

In FIG. 15, the first epitaxial structure 420 is in contact with the third top metal alloy layer 1310 and the first bottom metal alloy layer 1330. As such, the equivalent work function of the first epitaxial structure 420 can be tuned by applying different materials of the third top metal alloy layer 1310 and the first bottom metal alloy layer 1330. Furthermore, the second epitaxial structure 520 is in contact with the fourth top metal alloy layer 1320 and the second bottom metal alloy layer 1340. Since the first epitaxial structure 420 and the second epitaxial structure 520 have different cross sections, the source/drain features of the devices on the regions 102 and 104 have different equivalent work functions even though the third and fourth top metal alloy layers 1310 and 1320 have the same work function and the first and second bottom metal alloy layers 1330 and 1340 have the same work function. As such, the N-type and P-type devices can achieve their desired source/drain equivalent work functions in the same metal alloy layers formation process and without additional photo patterning flows.

Figure 16:
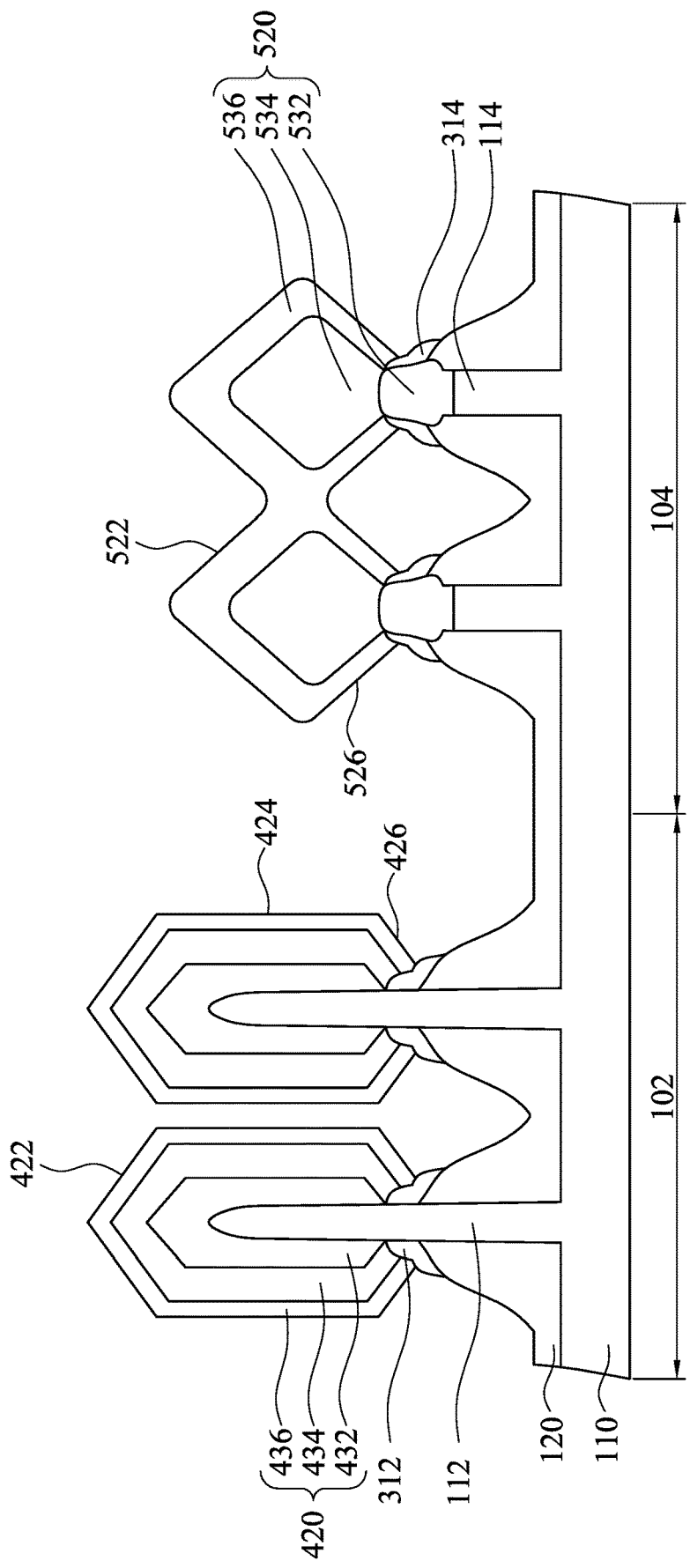
FIGS. 16-22 illustrate a method for manufacturing a semiconductor device at various stages in accordance with some embodiments of the present disclosure.

FIGS. 16-22 illustrate a method for manufacturing a semiconductor device at various stages in accordance with some embodiments of the present disclosure. The manufacturing processes of FIGS. 1 to 7 are performed in advance. Since the relevant manufacturing details are similar to FIGS. 1 to 7, and, therefore, a description in this regard will not be repeated hereinafter. Reference is made to FIG. 16. The first ILD 620 of FIG. 7 is removed to expose the first CESL 610 of FIG. 7. Then, the first CESL 610 is removed to expose the first epitaxial structures 420 and the second epitaxial structures 520. In this stage, the top surfaces 422, the sidewalls 424, and the bottom surfaces 426 of the first epitaxial structures 420 and the top surfaces 522 and the bottom surfaces 526 of the second epitaxial structures 520 are exposed.

Figure 17:
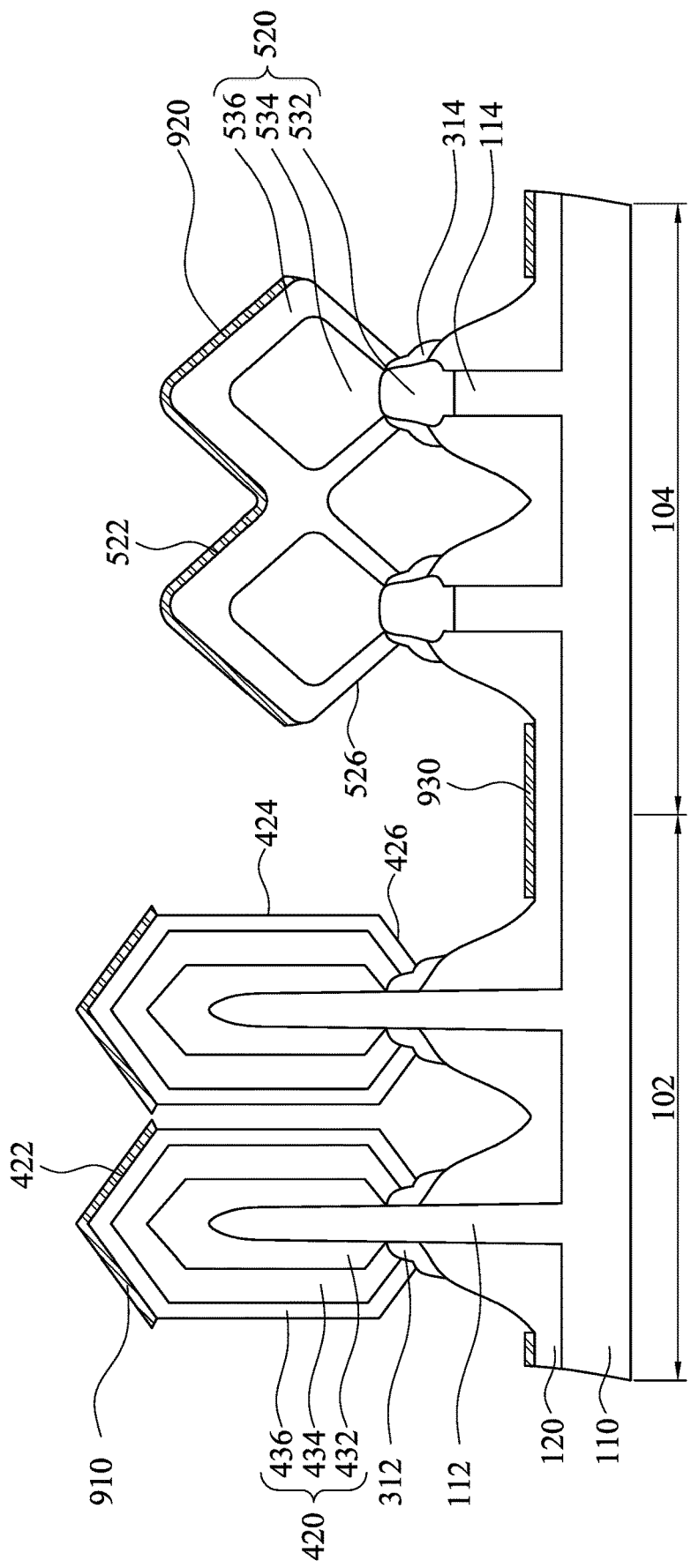

Reference is made to FIG. 17. A metal material is directionally (or anisotropically) formed over the structure of FIG. 16, such that a first metal layer 910 and a second metal layer 920 are respectively formed over the top surfaces 422 and 522. That is, the first metal layer 910 is in contact with the top surfaces 422 and not in contact with other surfaces of the first epitaxial structures 420, and the second metal layer 920 is in contact with the top surfaces 522 and not in contact with other surfaces of the second epitaxial structures 520. In some embodiments, portions of the metal material are formed over the isolation structures 120 to form the excess metal layer 930. The first metal layer 910 and the second metal layer 920 are made of Ni, Co, Pt, W, Ru, combinations thereof, or other suitable materials. The first metal layer 910 and the second metal layer 920 have high work function, for example, in a range from about 4.4 eV to about 5.2 eV. The first metal layer 910 and the second metal layer 920 are formed by performing a directionally deposition process, such as PVD, REPVD, ion CVD, or other suitable processes.

Figure 18:
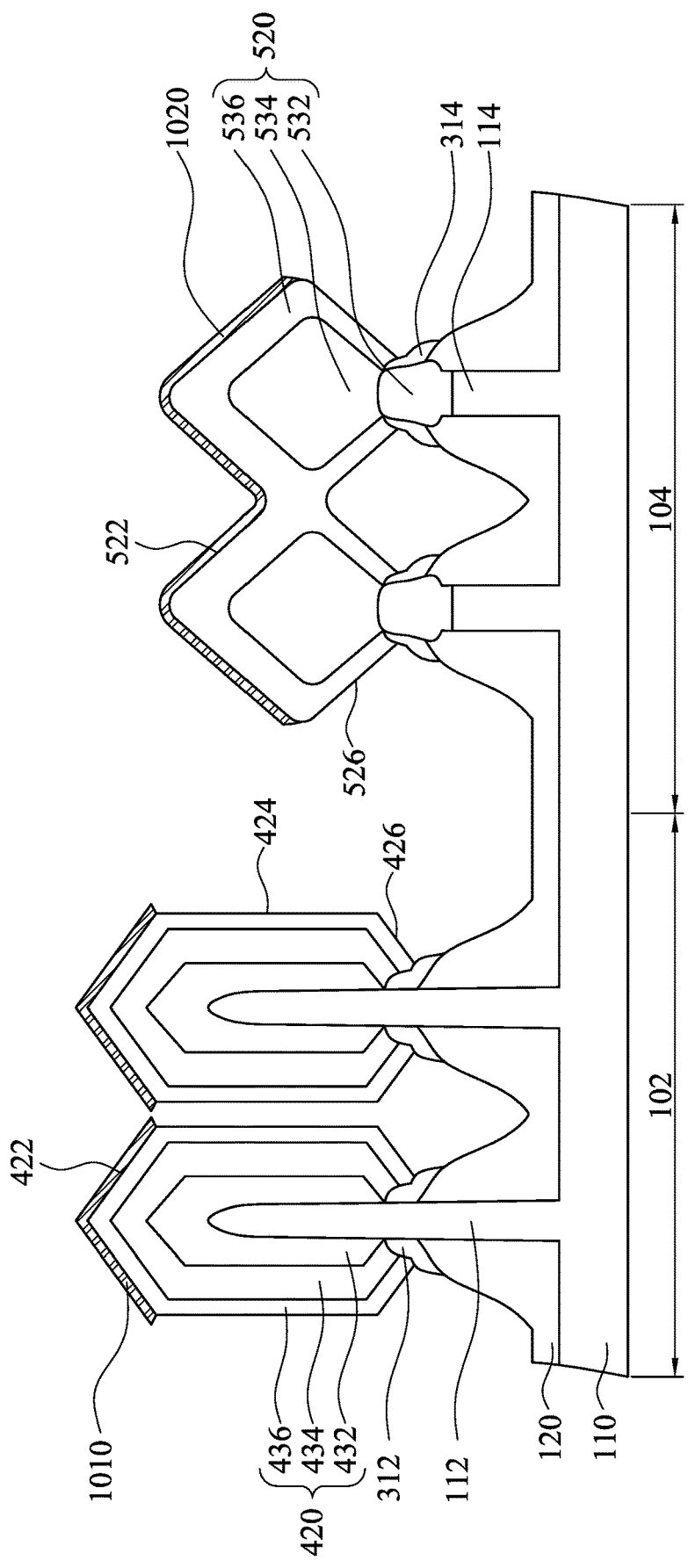

Reference is made to FIG. 18. An annealing process is performed on the first metal layer 910 (see FIG. 17), the second metal layer 920 (see FIG. 17), the first epitaxial structures 420, and the second epitaxial structures 520 to form a first top metal alloy layer 1010 and a second top metal alloy layer 1020 respectively. The annealing process is also referred to as a silicide process if the first epitaxial structures 420 and the second epitaxial structures 520 are made of silicon. After the annealing process, the unreacted metal (such as the excess metal layer 930 of FIG. 17) is removed.

Figure 19:
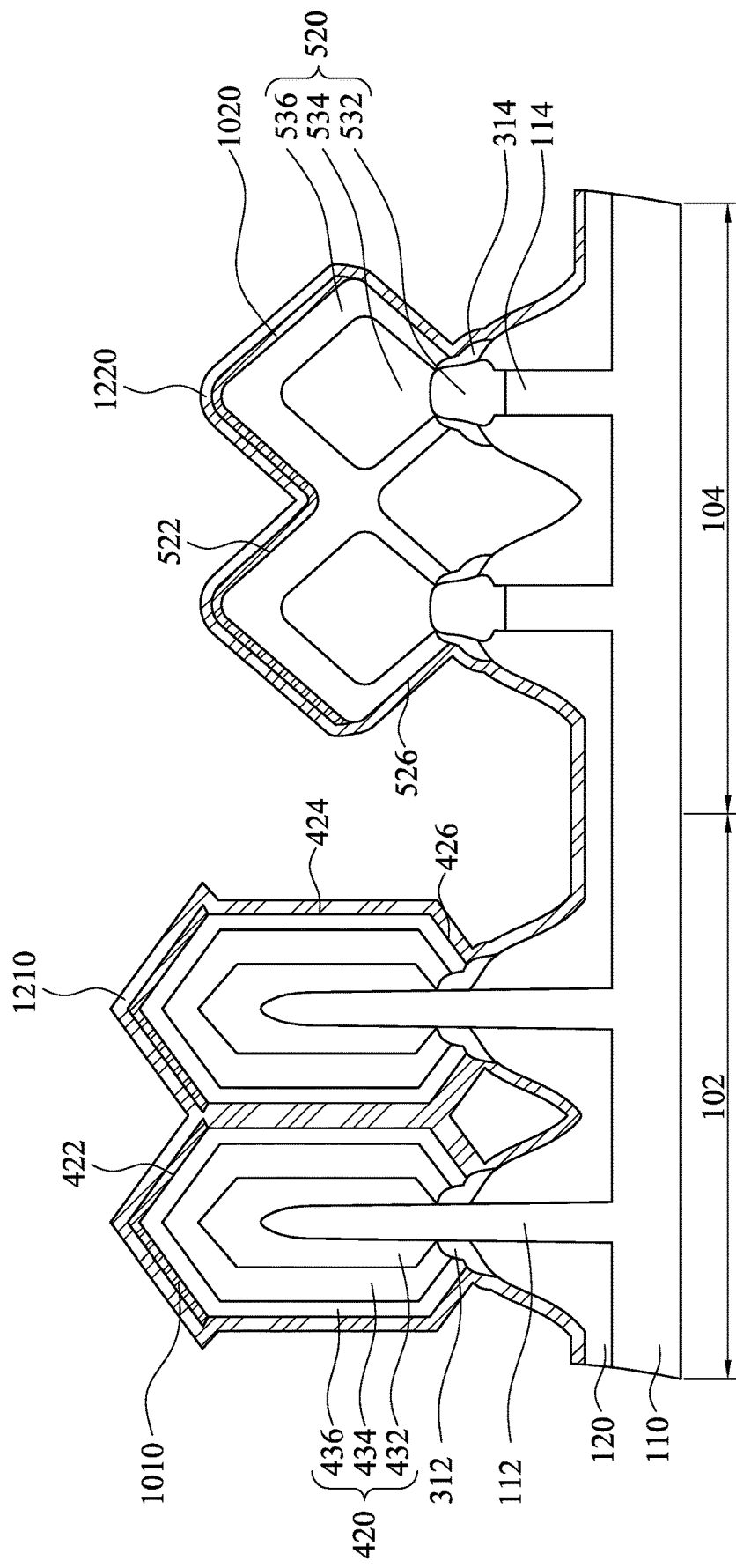

Reference is made to FIG. 19. Another metal material is conformally (or isotropically) formed over the structure of FIG. 18, such that a third metal layer 1210 and a fourth metal layer 1220 are respectively formed on the first epitaxial structures 420 and the second epitaxial structures 520. That is, the third metal layer 1210 is in contact with the first top metal alloy layer 1010 and the sidewalls 424 and the bottom surfaces 426 of the first epitaxial structures 420, and the fourth metal layer 1220 is in contact with the second top metal alloy layer 1020 and the bottom surfaces 526 of the second epitaxial structures 520. In some embodiments, the fourth metal layer 1220 is not formed under the merged portion of the second epitaxial structures 420. The third metal layer 1210 and the fourth metal layer 1220 are made of Ti, Er, Y, Yb, Eu, Tb, Lu, Th, Sc, Hf, Zr, Tb, Ta, combinations thereof, or other suitable materials. The third metal layer 1210 and the fourth metal layer 1220 have low work function, for example, in a range from about 2.5 eV to about 4.4 eV. That is, the third metal layer 1210 and the fourth metal layer 1220 have a work function lower than that of the first metal layer 910 and the second metal layer 920 as shown in FIG. 9. The third metal layer 1210 and the fourth metal layer 1220 are formed by performing a conformally deposition process, such as PECVD, PEALD, or other suitable processes.

Figure 20:
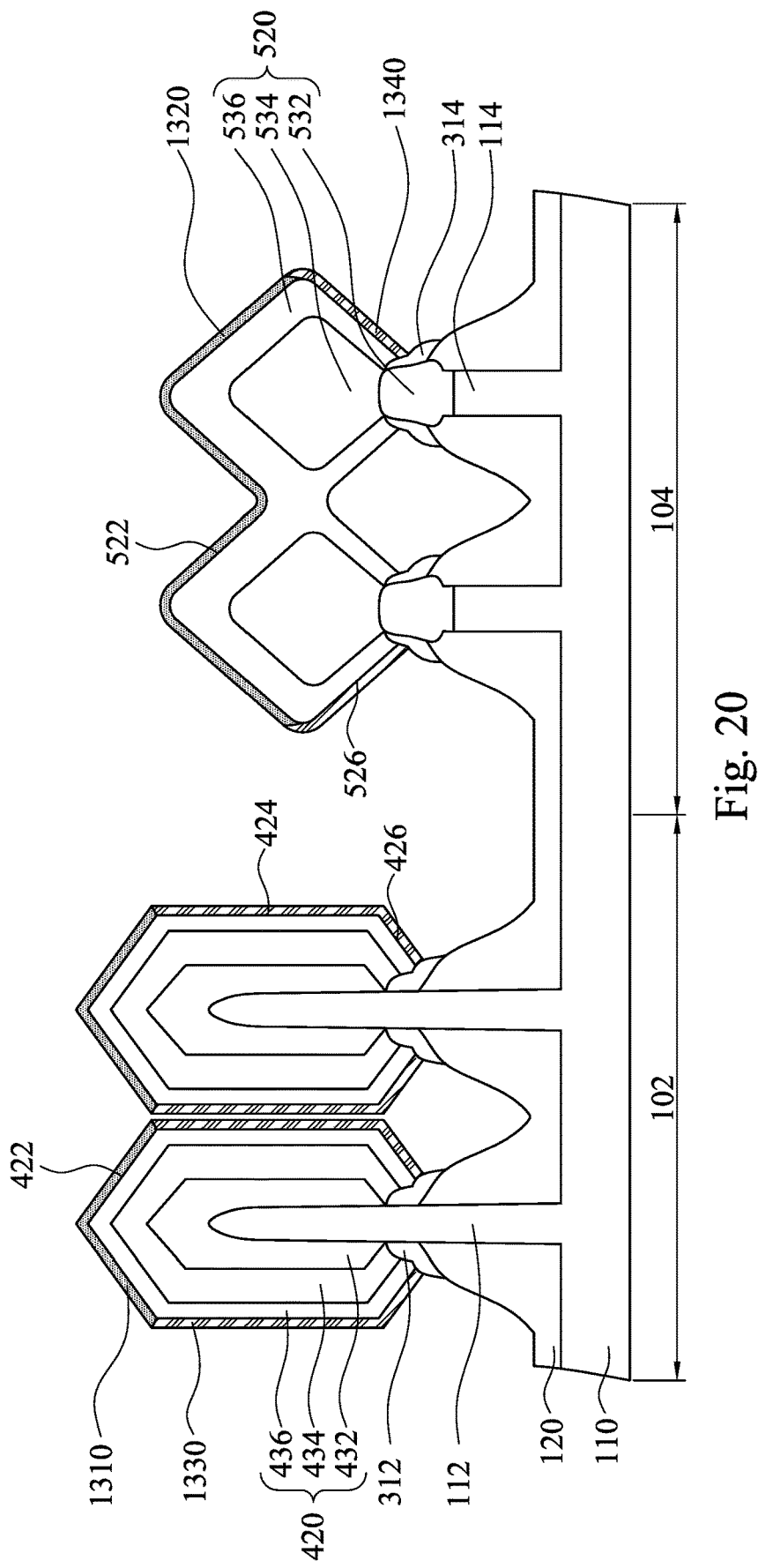

Reference is made to FIG. 20. Another annealing process is performed on the first top metal alloy layer 1010 (see FIG. 19), the second top metal alloy layer 1020 (see FIG. 19), the third metal layer 1210 (see FIG. 19), the fourth metal layer 1220 (see FIG. 19), the first epitaxial structures 420, and the second epitaxial structures 520. The first top metal alloy layer 1010, the third metal layer 1210, and the first epitaxial structures 420 are annealed to form a third top metal alloy layer 1310, the second top metal alloy layer 1020, the fourth metal layer 1220, and the second epitaxial structures 520 are annealed to form a fourth top metal alloy layer 1320, the third metal layer 1210 and the first epitaxial structures 420 are annealed to form a first bottom metal alloy layer 1330, and the fourth metal layer 1220 and the second epitaxial structures 520 are annealed to form a second bottom metal alloy layer 1340. The annealing process is also referred to as a silicide process if the first epitaxial structures 420 and the second epitaxial structures 520 are made of silicon. After the annealing process, the unreacted metal is removed. The third top metal alloy layer 1310 is in contact with the top surfaces 422 of the first epitaxial structures 420, the fourth top metal alloy layer 1320 is in contact with the top surfaces 522 of the second epitaxial structures 520, the first bottom metal alloy layer 1330 is in contact with the sidewalls 424 and the bottom surfaces 426 of the first epitaxial structures 420, and the second bottom metal alloy layer 1330 is in contact with the bottom surfaces 526 of the second epitaxial structures 520.

In some embodiments, the third top metal alloy layer 1310 and the fourth top metal alloy layer 1320 are made of a material including the high WF metals including Ni, Co, Pt, W, Ru, or combinations thereof and the low WF metals including Ti, Er, Y, Yb, Eu, Tb, Lu, Th, Sc, Hf, Zr, Tb, Ta, or combination thereof, and the first bottom metal alloy layer 1330 and the second bottom metal alloy layer 1340 include the low WF metals including Ti, Er, Y, Yb, Eu, Tb, Lu, Th, Sc, Hf, Zr, Tb, Ta, or combinations thereof. As such, the third top metal alloy layer 1310 and the fourth top metal alloy layer 1320 have higher work function than the first bottom metal alloy layer 1330 and the second bottom metal alloy layer 1340. For the first epitaxial structures 420, the contact areas between the first bottom metal alloy layer 1330 and the first epitaxial structures 420 is larger than the contact areas between the third top metal alloy layer 1310 and the first epitaxial structures 420, such that the equivalent work function of the source/drain feature of N-type device (i.e., the first epitaxial structures 420, the first bottom metal alloy layer 1330, and the third top metal alloy layer 1310 in this case) is between the work functions of the first bottom metal alloy layer 1330 and the third top metal alloy layer 1310 but close to the first bottom metal alloy layer 1330. For the second epitaxial structures 520, the contact areas between the fourth top metal alloy layer 1320 and the second epitaxial structures 520 is larger than the contact areas between the second bottom metal alloy layer 1340 and the second epitaxial structures 520, such that the equivalent work function of the source/drain feature of P-type device (i.e., the second epitaxial structures 520, the second bottom metal alloy layer 1340, and the fourth top metal alloy layer 1320 in this case) is between the work functions of the second bottom metal alloy layer 1340 and the fourth top metal alloy layer 1320 but close to the fourth top metal alloy layer 1320. Therefore, the source/drain features of N-type and P-type devices have different work functions.

Figure 21:
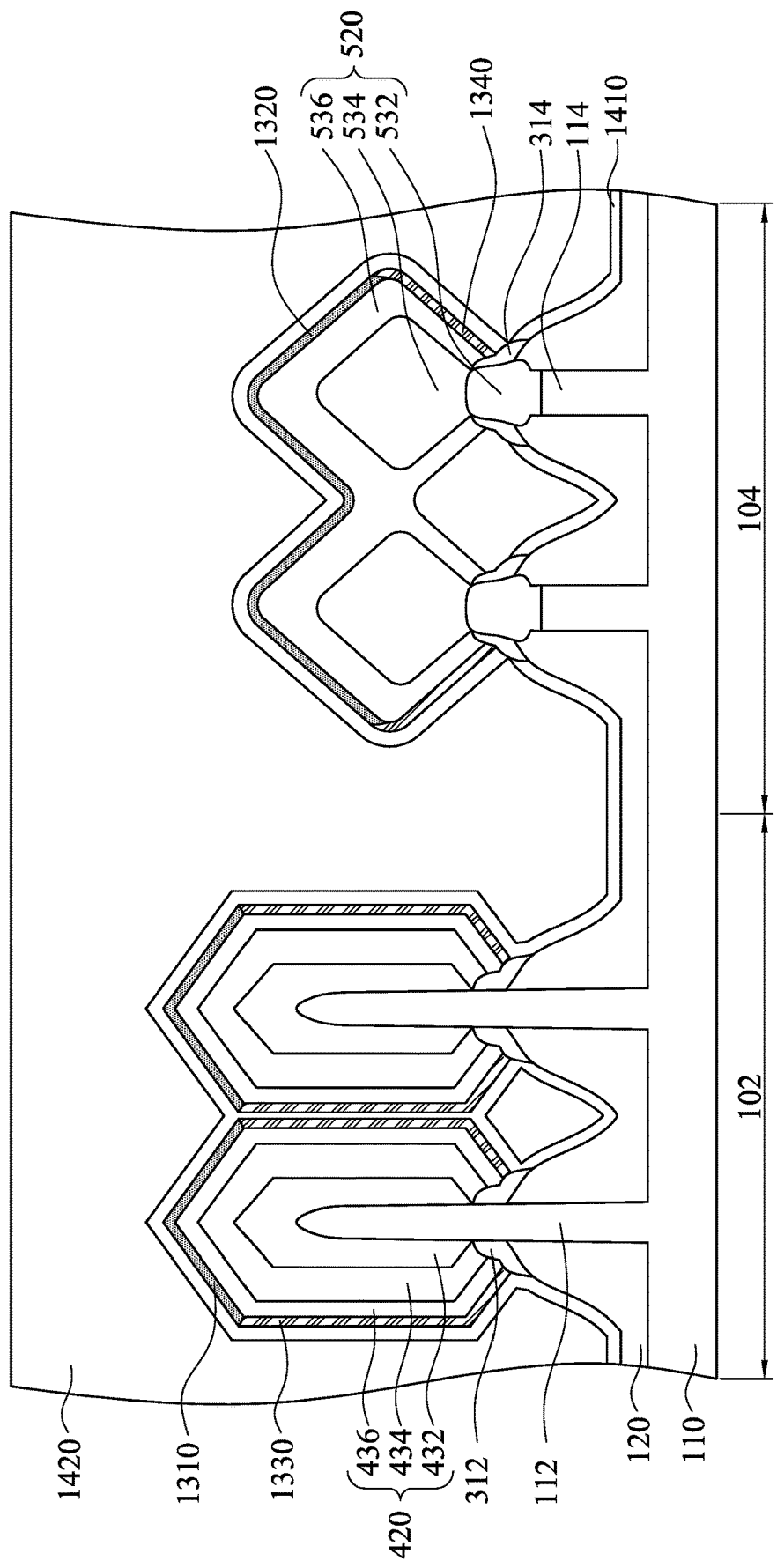

Reference is made to FIG. 21. A second contact etch stop layer (CESL) 1410 is conformally formed over the structure of FIG. 20. In some embodiments, the CESL 1410 is not formed under the merged portion of the second epitaxial structures 520. In some embodiments, the second CESL 1410 can be a stressed layer or layers. In some embodiments, the second CESL 1410 has a tensile stress and is formed of $Si_3N_4$. In some other embodiments, the second CESL 1410 includes materials such as oxynitrides. In yet some other embodiments, the second CESL 1410 may have a composite structure including a plurality of layers, such as a silicon nitride layer overlying a silicon oxide layer. The second CESL 1410 can be formed using plasma enhanced CVD (PECVD), however, other suitable methods, such as low pressure CVD (LPCVD), atomic layer deposition (ALD), and the like, can also be used.

A second interlayer dielectric (ILD) 1420 is then formed on the second CESL 1410. The second ILD 1420 may be formed by chemical vapor deposition (CVD), high-density plasma CVD, spin-on, sputtering, or other suitable methods. In some embodiments, the second ILD 1420 includes silicon oxide. In some other embodiments, the second ILD 1420 may include silicon oxy-nitride, silicon nitride, or a low-k material.

Figure 22:
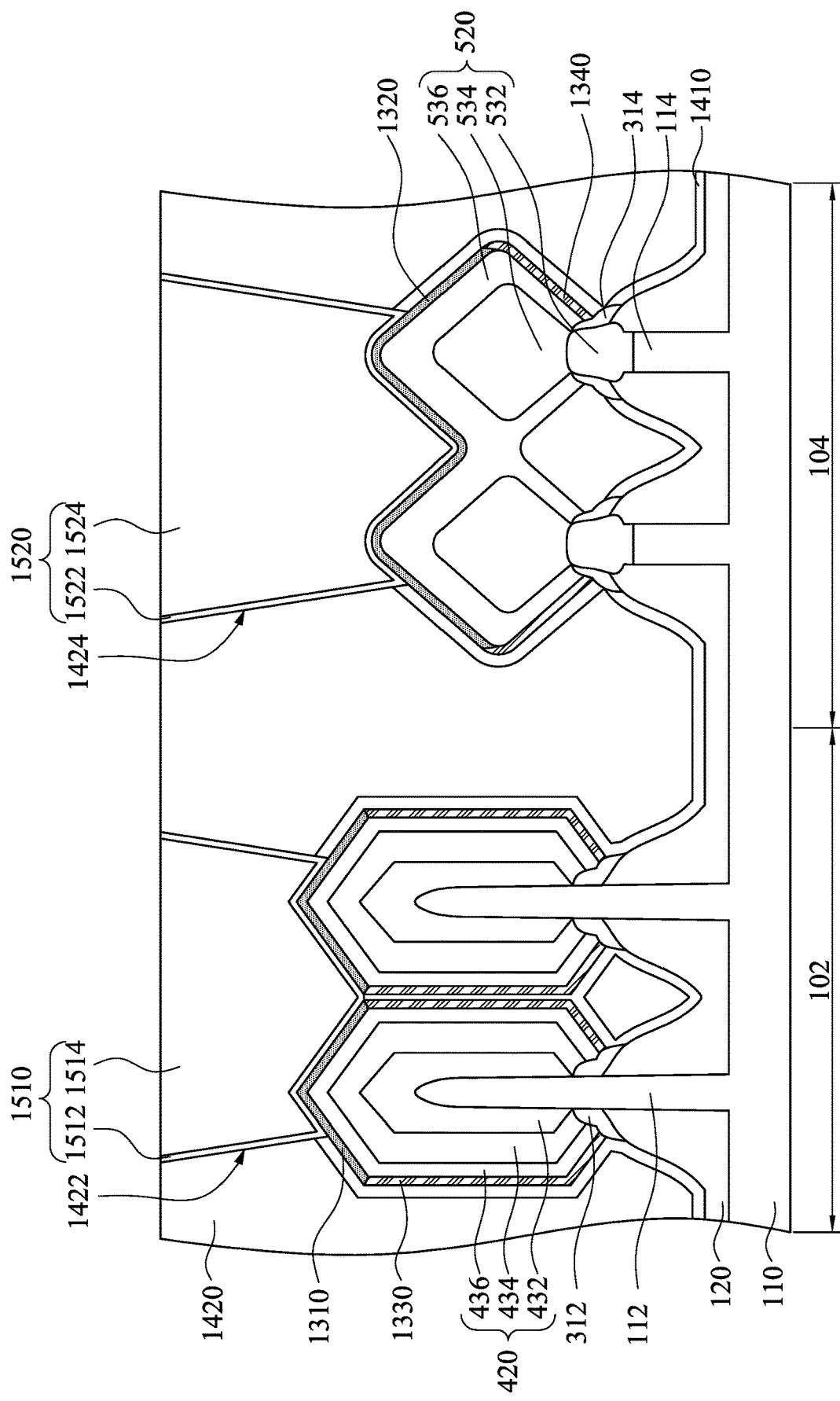

Reference is made to FIG. 22. The second ILD 1420 and the second CESL 1410 are partially removed to form a plurality of openings 1422 and 1424 by various methods, including a dry etch, a wet etch, or a combination of dry etch and wet etch. The openings 1422 and 1424 extend through the second ILD 1420 and the second CESL 1410 and respectively expose the third top metal alloy layer 1310 and the fourth top metal alloy layer 1320.

Contacts 1510 and 1520 are respectively formed in the openings 1422 and 1424 and respectively over the third top metal alloy layer 1310 and the fourth top metal alloy layer 1320. The contacts 1510 and 1520 are respectively and electrically connected to the first epitaxial structures 420 and the second epitaxial structures 520. The contact 1510 includes a barrier layer 1512 and a filling material 1514 formed over the barrier layer 1512. The contact 1520 includes a barrier layer 1522 and a filling material 1524 formed over the barrier layer 1522. In some embodiments, metal materials can be filled in the openings 1422 and 1424, and excessive portions of the metal materials are removed by performing a planarization process to form the filling materials 1514 and 1524. In some embodiments, the barrier layers 1512 and 1522 may include one or more layers of a material such as, for example, titanium, titanium nitride, titanium tungsten or combinations thereof. In some embodiments, the filling materials 1514 and 1524 may be made of, for example, tungsten, aluminum, copper, or other suitable materials.

Figure 23:
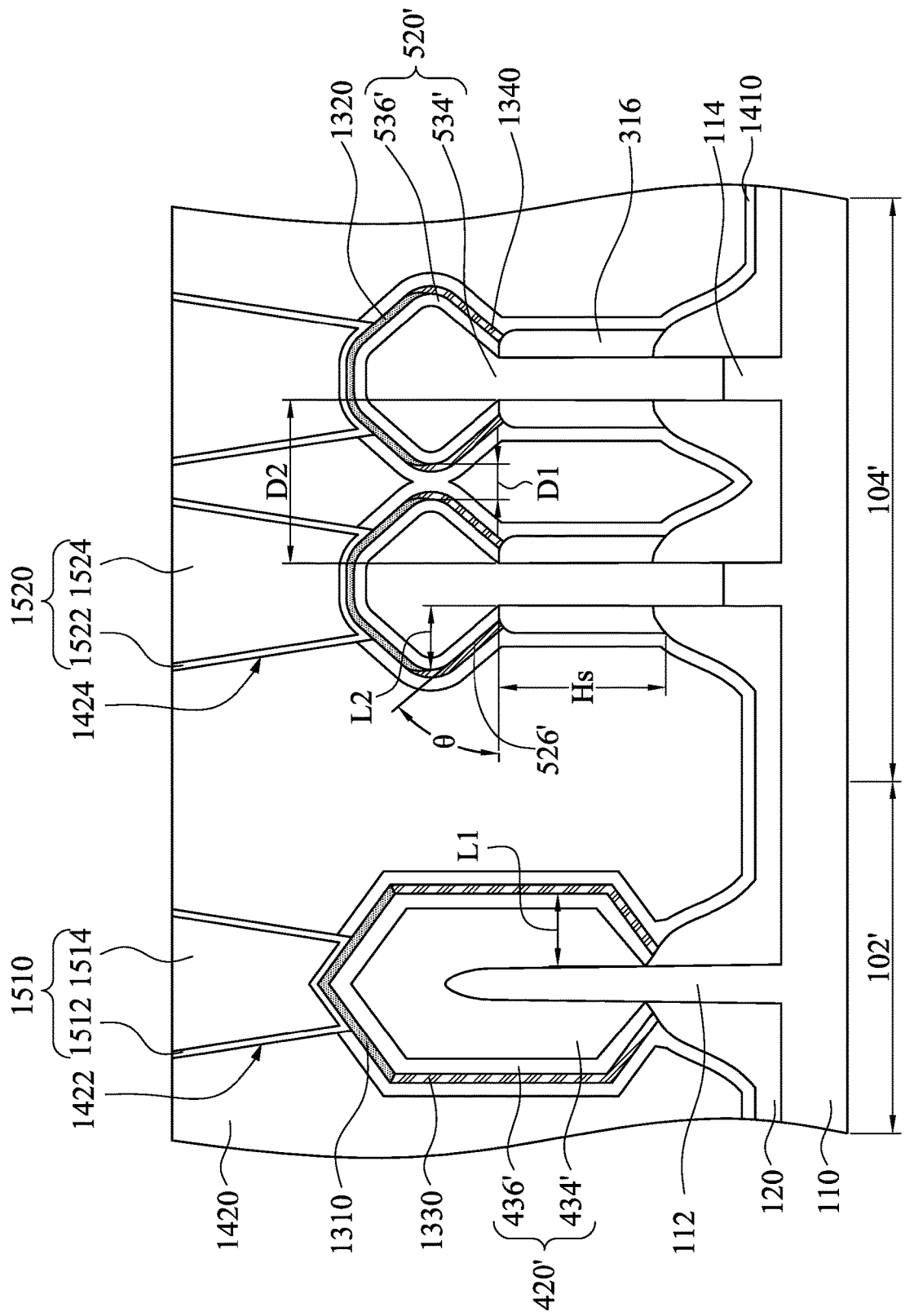
FIG. 23 is a cross-sectional view of a semiconductor device in accordance with some embodiments of the present disclosure.

In some embodiments, the N-type device (the device over the region 102) in FIGS. 15 and 22 can be an N-type target critical dimension (TCD) device, and the P-type device (the device over the region 104) in FIGS. 15 and 22 can be a P-type TCD device. FIG. 23 is a cross-sectional view of a semiconductor device in accordance with some embodiments of the present disclosure. The semiconductor device includes an N-type device over a first region 102' of the substrate 110 and P-type devices over a second region 104' of the substrate 110. The semiconductor device may be a part of a SRAM device. The P-type devices can be pull-up (PU) transistors and the N-type device can be a pull-down (PD) transistor or a pass gate (PG) transistor. It is noted that the numbers of the N-type device and P-type devices in FIG. 23 are illustrative, and should not limit the claimed scope of the present disclosure.

The N-type device includes a first epitaxial structure 420' and a gate structure (e.g., the metal gate stack 710 shown in FIG. 7) adjacent the first epitaxial structure 420', and the P-type device includes second epitaxial structures 520' and a gate structure (e.g., the metal gate stack 710 shown in FIG. 7) adjacent the second epitaxial structures 520'. The first epitaxial structure 420' includes a first epitaxial layer 434' formed on the semiconductor fin 112 and a second epitaxial layer 436' formed on the first epitaxial layer 434'. The first and second epitaxial layers 434' and 436' are crystalline semiconductor layers, such as Si, SiC, SiCP, SiP, Ge and SiGe, having different lattice constants from each other and from the semiconductor fins 112. When SiC, SiP and/or SiCP are used, the C or P concentration of the first epitaxial layer 434' is different from that of the second epitaxial layer 436'. In some embodiments, a Group III-V semiconductor layer is used for at least one of the first and second epitaxial layers 434' and 436'. In some other embodiments, only one of the first and second epitaxial layers 434' and 436' is formed, and in some other embodiments, more epitaxial layers are formed. In some embodiments, a lateral extension distance L1 of the first epitaxial structures 420' extending from a sidewall of the semiconductor fin 112 is less than about 7 nm.

The third top metal alloy layer 1310 and the first bottom metal alloy layer 1330 are formed on the second epitaxial layer 436'. The third top metal alloy layer 1310 and the first bottom metal alloy layer 1330 are formed by a reaction between the material of the second epitaxial layer 436' and metal layers formed thereon.

The second epitaxial structures 520' each include a third epitaxial layer 534' formed on the semiconductor fin 114 and a fourth epitaxial layer 536' formed on the third epitaxial layer 534'. The third and fourth epitaxial layers 534' and 536' are crystalline semiconductor layers, such as Si, SiC, SiCP, SiP, Ge and SiGe, having different lattice constants from each other and from the semiconductor fins 112. When SiGe are used, the Ge concentration of the third epitaxial layer 534' is different from that of the fourth epitaxial layer 536'. In some embodiments, a Group III-V semiconductor layer is used for at least one of the third and fourth epitaxial layers 534' and 536'. In some other embodiments, only one of the third and fourth epitaxial layers 534' and 536' is formed, and in some other embodiments, more epitaxial layers are formed. In some embodiments, a lateral extension distance L2 of the second epitaxial structures 520' extending from a sidewall of the semiconductor fin 114 is less than about 7 nm. Furthermore, in some embodiments, the spacer residues 316 are formed on the sidewalls of the semiconductor fins 114, and the height Hs of the spacer residues 316 is in a range of 0 nm to about ⅔ of the fin height. The height Hs of the spacer residues 316 is associated with the size of the second epitaxial structures 520'.

Further, the fourth top metal alloy layers 1320 and the second bottom metal alloy layers 1340 are formed on the fourth epitaxial layer 536'. The fourth top metal alloy layers 1320 and the second bottom metal alloy layers 1340 are formed by a reaction between the material of the fourth epitaxial layer 536' and metal layers formed thereon. As shown in FIG. 23, the fourth epitaxial layer 536' of one of the second epitaxial structures 520' is separated from the fourth epitaxial layer 536' of the other one of the second epitaxial structure 520'. For example, a distance D1 between the second epitaxial structures 520' is in a range from about 10 nm to about 15 nm, and a distance D2 between the semiconductor fins 114 is in a range from about 15 nm to about 30 nm. If the distance D1 is less than about 10 nm and/or the distance D2 is less than about 15 nm, the second epitaxial structure 520' may be merged. If the distance D2 is greater than about 15 nm and/or the distance D2 is greater than about 30 nm, the layout area of the semiconductor device may be increased. Moreover, the surface 526' and the top surface of the substrate 110 form an angle θ in a range from about 35 degrees to about 60 degrees, e.g., about 40 degrees or about 54.7 degrees.

According to some embodiments, the first epitaxial structure is in contact with the third top metal alloy layer and the first bottom metal alloy layer. As such, the equivalent work function of the first epitaxial structure can be tuned by applying different materials of the third top metal alloy layer and the first bottom metal alloy layer. Furthermore, the second epitaxial structure is in contact with the fourth top metal alloy layer and the second bottom metal alloy layer. For a semiconductor device including different types (e.g., N-type and P-type) devices, since the first epitaxial structure and the second epitaxial structure have different cross sections, the source/drain features of the N-type and P-type devices have different equivalent work functions even though the third and fourth top metal alloy layers have the same work function and the first and second bottom metal alloy layers have the same work function. As such, the N-type and P-type devices can achieve their desired source/drain equivalent work functions in the same metal alloy layers formation process and without additional photo patterning flows.

According to some embodiments, a semiconductor device includes first and second epitaxial structures, first and second top metal alloy layers, and first and second bottom metal alloy layers. The first and second epitaxial structures have different cross sections. The first and second top metal alloy layers are respectively in contact with the first and second epitaxial structures. The first and second bottom metal alloy layers are respectively in contact with the first and second epitaxial structures and respectively under the first and second top metal alloy layers. The first top metal alloy layer and the first bottom metal alloy layer are made of different materials.

According to some embodiments, a semiconductor device includes a first epitaxial structure, a second epitaxial structure, first and second top metal alloy layers, and first and second bottom metal alloy layers. The first epitaxial structure has an upward facing facet facing upwards and a downward facing facet facing downwards. The second epitaxial structure has an upward facing facet facing upwards and a downward facing facet facing downwards. The first epitaxial structure and the second epitaxial structure have different conductivity types. The first and second top metal alloy layers are respectively in contact with the upward facing facet of the first epitaxial structure and the upward facing facet of the second epitaxial structure. The first and second bottom metal alloy layers are respectively in contact with the downward facing facet of the first epitaxial structure and the downward facing facet of the second epitaxial structure. The first top metal alloy layer and the first bottom metal alloy layer have different work functions.

According to some embodiments, a method for manufacturing a semiconductor device includes forming first and second epitaxial structures over a substrate, wherein the first and second epitaxial structures have different conductivity types, and the first and second epitaxial structures each has an upward facing facet facing upwards and a downward facing facet facing downwards. First and second metal layers are formed respectively on the upward facing facets of the first and second epitaxial structures. The first and second metal layers and the first and second epitaxy structures are annealed to form a first top metal alloy layer on the upward facing facet of the first epitaxial structure and a second top metal alloy layer on the upward facing facet of the second epitaxial structure. A third metal layer is formed at least on the downward facing facets of the first and second epitaxial structures. The first and third metal layers have different metals. The third metal layer and the first and second epitaxial structures are annealed to form a first bottom metal alloy layer on the downward facing facet of the first epitaxial structure, and a second bottom metal alloy layer on the downward facing facet of the second epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductive fin;
   an isolation structure surrounding a bottom portion of the semiconductive fin;
   a gate structure over the semiconductive fin;
   dielectric spacers on opposite sides of the semiconductive fin and over the isolation structure, wherein the dielectric spacers comprise nitride;
   source/drain epitaxial structures on opposite sides of the gate structure and over the dielectric spacers, wherein the source/drain epitaxial structures have hexagon shapes, and bottommost surfaces of the dielectric spacers are higher than a topmost surface of a portion of the semiconductive fin below one of the source/drain epitaxial structures; and
   a first metal alloy layer on a first sidewall of one of the source/drain epitaxial structures and in contact with at least one of the dielectric spacers, wherein tops of the dielectric spacers are higher than a bottom position of the first metal alloy layer.

2. The device of claim 1, wherein the gate structure extends in a first direction, one of the dielectric spacers has a first width in the first direction, and one of the source/drain epitaxial structures has a second width greater than the first width.

3. The device of claim 1, wherein the gate structure extends in a first direction, a distance between the dielectric spacers in the first direction is smaller than a width of one of the source/drain epitaxial structures in the first direction.

4. The device of claim 1, further comprising:
   a gate spacer on a sidewall of the gate structure, wherein the dielectric spacers are in contact with the gate spacer.

5. The device of claim 1, further comprising:
   a second metal alloy layer in contact with a second sidewall of said one of the source/drain epitaxial structures and in contact with the first metal alloy layer, wherein the first metal alloy layer and the second metal alloy layer comprise different materials.

6. The device of claim 1, wherein a topmost surface of the first metal alloy layer is lower than a topmost surface of said one of the source/drain epitaxial structures.

7. The device of claim 1, wherein a bottommost portion of said one of the source/drain epitaxial structures is lower than the tops of the dielectric spacers.

8. The device of claim 1, wherein the first metal alloy layer has a top position lower than top surfaces of the source/drain epitaxial structures, and the first metal alloy layer is a silicide of a metal element, and the metal element is Ti, Er, Y, Yb, Eu, Tb, Lu, Th, Sc, Hf, Zr, Tb, or Ta.

9. A device comprising:
a fin structure protruding from a substrate, wherein the fin structure comprises a first portion and second portions on opposite sides of the first portion;
a gate structure crossing the first portion of the fin structure;
first and second source/drain epitaxial structures on opposite sides of the gate structure and respectively over the second portions of the fin structure, wherein the first source/drain epitaxial structure has a plurality of facets;
a silicon-oxynitride residue on a sidewall of one of the second portions of the fin structure, wherein one of the facets of the first source/drain epitaxial structure extends to the silicon-oxynitride residue, and the first source/drain epitaxial structure covers an outer sidewall of the silicon-oxynitride residue; and
a metal alloy layer on a sidewall of the first source/drain epitaxial structure, wherein a top position of the metal alloy layer is lower than a top position of the first source/drain epitaxial structure.

10. The device of claim 9, further comprising:
an STI structure between the silicon-oxynitride residue and the substrate.

11. The device of claim 10, wherein the first source/drain epitaxial structure is separated from the STI structure by the silicon-oxynitride residue.

12. The device of claim 9, wherein the metal alloy layer is in contact with the outer sidewall of the silicon-oxynitride residue.

13. The device of claim 9, wherein a portion of the silicon-oxynitride residue is embedded in the first source/drain epitaxial structure.

14. The device of claim 9, wherein a portion of the silicon-oxynitride residue is sandwiched between the first source/drain epitaxial structure and the fin structure.

15. The device of claim 9, further comprising:
a contact over the first source/drain epitaxial structure, wherein a bottom position of the contact is higher than the top position of the metal alloy layer.

16. A device comprising:
a semiconductor fin;
an isolation structure adjacent to the semiconductor fin;
first and second spacer residues on opposite sides of a first portion of the semiconductor fin and over the isolation structure;
a gate structure covering a second portion of the semiconductor fin; and
first and second source/drain epitaxial structures on opposite sides of the gate structure, wherein the first source/drain epitaxial structure comprises:
a first epitaxial layer sandwiched between the first and second spacer residues; and
a second epitaxial layer connected to the first epitaxial layer and over the first and second spacer residues, wherein the second epitaxial layer is spaced apart from sidewalls of the first epitaxial layer; and
a first metal alloy layer in contact with a bottom portion of the second epitaxial layer of the first source/drain epitaxial structure and the first spacer residue, wherein a top position of the first spacer residue is higher than a bottom position of the first metal alloy layer.

17. The device of claim 16, further comprising:
a second metal alloy layer in contact with a top portion of the second epitaxial layer of the first source/drain epitaxial structure and spaced apart from the first spacer residue, wherein the first metal alloy layer and the second metal alloy layer are made of different materials.

18. The device of claim 17, further comprising:
an etch stop layer covering and in contact with both the first metal alloy layer and the second metal alloy layer; and
an interlayer dielectric layer covering the etch stop layer.

19. The device of claim 16, wherein the first source/drain epitaxial structure further comprises a third epitaxial layer between the first epitaxial layer and the second epitaxial layer.

20. The device of claim 16, wherein the first metal alloy layer has a top position lower than a top surface of the first source/drain epitaxial structure, and the first metal alloy layer is a silicide of a metal element, and the metal element is Ti, Er, Y, Yb, Eu, Tb, Lu, Th, Sc, Hf, Zr, Tb, or Ta.

* * * * *